(12) United States Patent
Kubota et al.

(10) Patent No.: US 12,484,412 B2
(45) Date of Patent: Nov. 25, 2025

(54) DISPLAY DEVICE, DISPLAY MODULE, AND ELECTRONIC DEVICE

(71) Applicant: Semiconductor Energy Laboratory Co., Ltd., Atsugi (JP)

(72) Inventors: Daisuke Kubota, Atsugi (JP); Ryo Hatsumi, Hadano (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 467 days.

(21) Appl. No.: 17/795,922

(22) PCT Filed: Jan. 19, 2021

(86) PCT No.: PCT/IB2021/050362
§ 371 (c)(1),
(2) Date: Jul. 28, 2022

(87) PCT Pub. No.: WO2021/152418
PCT Pub. Date: Aug. 5, 2021

(65) Prior Publication Data
US 2023/0117024 A1    Apr. 20, 2023

(30) Foreign Application Priority Data

Jan. 31, 2020   (JP) ................................ 2020-015501
Mar. 25, 2020   (JP) ................................ 2020-054238

(51) Int. Cl.
*H10K 59/38*     (2023.01)
*G02B 5/20*      (2006.01)
(Continued)

(52) U.S. Cl.
CPC ............... *H10K 59/38* (2023.02); *G02B 5/20* (2013.01); *H10K 39/34* (2023.02); *H10K 50/15* (2023.02);
(Continued)

(58) Field of Classification Search
CPC ........ H10K 50/15; H10K 50/16; H10K 50/81; H10K 59/00; H10K 59/38; H10K 59/10;
(Continued)

(56) References Cited

U.S. PATENT DOCUMENTS 8,884,509 B2   11/2014  Matsukura
9,088,006 B2    7/2015  Yamazaki et al.
(Continued)

FOREIGN PATENT DOCUMENTS

CN     106104660 A    11/2016
CN     107680988 A     2/2018
(Continued)

OTHER PUBLICATIONS

International Search Report (Application No. PCT/IB2021/050362) Dated Apr. 6, 2021.
(Continued)

*Primary Examiner* — Steven B Gauthier
*Assistant Examiner* — Adam D Weiland
(74) *Attorney, Agent, or Firm* — Eric J. Robinson; Robinson Intellectual Property Law Office, P.C.

(57) ABSTRACT

A display device provided with an image capturing function is provided. A display device with both high viewing angle characteristics and high image capturing performance is provided. The display device includes a light-emitting and light-receiving element and a color filter. The light-emitting and light-receiving element includes a light-emitting and light-receiving region having a function of emitting light of the first color and a function of receiving light of the second color. The color filter is positioned over the light-emitting and light-receiving element and has a function of transmitting the light of the first color and a function of blocking the light of the second color. The color filter includes an opening portion. The light-emitting and light-receiving region
(Continued)

includes a portion positioned in the inside of the opening portion in the plan view.

22 Claims, 24 Drawing Sheets

(51) Int. Cl.
| | |
|---|---|
| *H10K 39/34* | (2023.01) |
| *H10K 50/15* | (2023.01) |
| *H10K 50/16* | (2023.01) |
| H10K 59/12 | (2023.01) |
| H10K 59/80 | (2023.01) |
| H10K 102/00 | (2023.01) |

(52) U.S. Cl.
CPC ............ *H10K 50/16* (2023.02); *H10K 59/12* (2023.02); *H10K 59/8792* (2023.02); *H10K 2102/302* (2023.02)

(58) Field of Classification Search
CPC .... H10K 59/12; H10K 59/8792; H10K 39/34; H10K 2102/302; H10K 65/00; H10K 39/32; G02B 5/20; G06F 3/041; G06F 3/042; G09F 9/00; G09F 9/30; H05B 33/02; H05B 33/06; H05B 33/12; H05B 33/14; H10D 30/021; H10D 30/67; H10F 39/12; H10F 39/10–813; H10F 39/198; H10F 39/18–1898; H10F 19/00–908; H10F 55/00

See application file for complete search history.

(56) References Cited

U.S. PATENT DOCUMENTS

| | | |
|---|---|---|
| 9,370,074 B2 | 6/2016 | Kurokawa |
| 9,601,713 B2 | 3/2017 | Fukagawa |
| 9,627,648 B2 | 4/2017 | Yamazaki et al. |
| 10,003,047 B2 | 6/2018 | Yamazaki et al. |
| 10,032,834 B2 | 7/2018 | Udaka et al. |
| 10,381,599 B2 | 8/2019 | Yamazaki et al. |
| 10,903,453 B2 | 1/2021 | Yamazaki et al. |
| 2012/0113160 A1 | 5/2012 | Kurokawa |
| 2012/0223979 A1 | 9/2012 | Matsukura |
| 2014/0340363 A1 | 11/2014 | Ikeda et al. |
| 2015/0221706 A1* | 8/2015 | Udaka .................... H10K 39/32 257/40 |
| 2017/0077436 A1 | 3/2017 | Yue et al. |
| 2018/0089491 A1 | 3/2018 | Kim et al. |
| 2018/0095195 A1 | 4/2018 | Kim et al. |
| 2018/0158877 A1 | 6/2018 | Zeng et al. |
| 2020/0160023 A1* | 5/2020 | Hu ...................... G02F 1/13338 |
| 2020/0265207 A1* | 8/2020 | Chu ....................... G06F 21/32 |
| 2020/0395576 A1 | 12/2020 | Yamazaki et al. |

FOREIGN PATENT DOCUMENTS

| | | |
|---|---|---|
| CN | 107871447 A | 4/2018 |
| EP | 3306526 A | 4/2018 |
| JP | 2012-113291 A | 6/2012 |
| JP | 2013-045977 A | 3/2013 |
| JP | 2014-197522 A | 10/2014 |
| JP | 2014-222617 A | 11/2014 |
| JP | 2016-218476 A | 12/2016 |
| JP | 2018-049042 A | 3/2018 |
| JP | 7574228 | 10/2024 |
| KR | 2012-0048474 A | 5/2012 |
| KR | 2018-0034750 A | 4/2018 |
| TW | 201407843 | 2/2014 |
| TW | 201824221 | 7/2018 |
| WO | WO-2014/024582 | 2/2014 |

OTHER PUBLICATIONS

Written Opinion (Application No. PCT/IB2021/050362) Dated Apr. 6, 2021.
Taiwanese Office Action (Application No. 110102343) Dated Dec. 30, 2024.

* cited by examiner

FIG. 12A    FIG. 12B    FIG. 12C
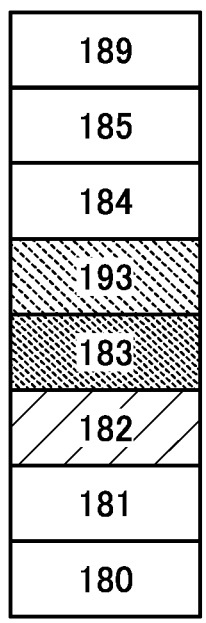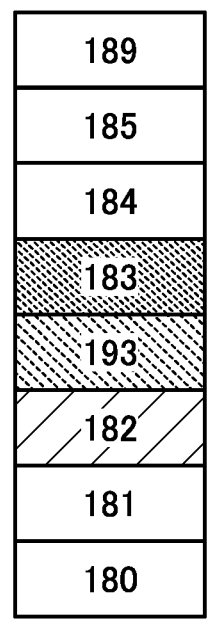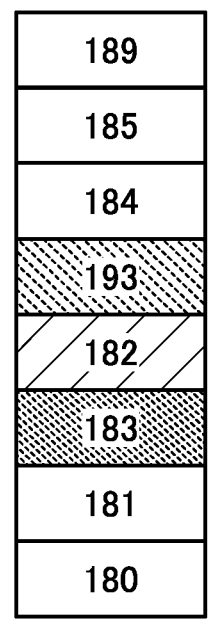
FIG. 12D    FIG. 12E
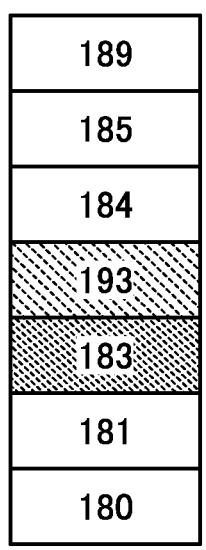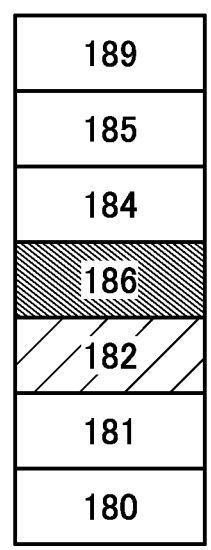

DISPLAY DEVICE, DISPLAY MODULE, AND ELECTRONIC DEVICE

TECHNICAL FIELD

One embodiment of the present invention relates to a display device. One embodiment of the present invention relates to a display device provided with an image capturing function.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, display devices have been required to have higher definition in order to display high-resolution images. In addition, display devices used in information terminal devices such as smartphones, tablet terminals, and laptop PCs (personal computers) have been required to have lower power consumption as well as higher definition. Furthermore, display devices have been required to have a variety of functions such as a touch panel function and a function of capturing images of fingerprints for authentication, in addition to a function of displaying images.

Light-emitting devices including light-emitting elements have been developed, for example, as display devices. Light-emitting elements (also referred to as EL elements) utilizing an electroluminescence (hereinafter referred to as EL) phenomenon have features such as ease of reduction in thickness and weight, high-speed response to an input signal, and driving with a direct-current constant voltage source, and have been used in display devices. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a display device with an image capturing function. An object of one embodiment of the present invention is to provide an imaging device or a display device that is capable of clearly capturing an image of a fingerprint or the like. An object of one embodiment of the present invention is to provide a display device with improved viewing angle characteristics. An object of one embodiment of the present invention is to provide a display device with both high viewing angle characteristics and high image capturing performance. An object of one embodiment of the present invention is to provide an imaging device or a display device that is capable of capturing an image with high sensitivity. An object of one embodiment of the present invention is to provide a display device that functions as a touch panel. An object of one embodiment of the present invention is to reduce the number of components of an electronic device. An object of one embodiment of the present invention is to provide a multifunctional display device. An object of one embodiment of the present invention is to provide a display device, an imaging device, an electronic device, or the like that has a novel structure. An object of one embodiment of the present invention is to reduce at least one of problems of the conventional technique.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a display device including a light-emitting and light-receiving element and a color filter. The light-emitting and light-receiving element includes a light-emitting and light-receiving region having a function of emitting light of the first color and a function of receiving light of the second color. The color filter is positioned over the light-emitting and light-receiving element and has a function of transmitting the light of the first color and a function of blocking the light of the second color. The color filter includes an opening portion. The light-emitting and light-receiving region includes a portion positioned in the inside of the opening portion in the plan view.

The display device preferably includes a portion where the color filter and an outer edge portion of the light-emitting and light-receiving region overlap with each other in the plan view.

In the display device, it is preferable that an end portion of the light-emitting and light-receiving region be positioned in the inside of the opening portion and a space be provided between the light-emitting and light-receiving region and the color filter in the plan view In addition, in the above, a light-blocking layer is preferably included. At this time, the light-blocking layer is positioned over the light-emitting and light-receiving element and has a function of blocking light of the first color and light of the second color. The light-blocking layer is preferably positioned on an outer side than the opening portion of the color filter in the plan view. The color filter preferably includes the first portion and the second portion. The first portion is a portion overlapping with the light-blocking layer in the plan view, and the second portion is a portion positioned between the first portion and the opening portion in the plan view and overlapping with neither the light-blocking layer nor the light-emitting and light-receiving element.

In addition, in the above, a light-emitting element is preferably included. At this time, the light-emitting element preferably includes a light-emitting region having a function of emitting light of the second color. In addition, the light-emitting element is preferably provided on the same surface as the light-emitting and light-receiving element.

Furthermore, in the above, the light-emitting and light-receiving element preferably includes an electron-injection layer, an electron-transport layer, a light-emitting layer, an active layer, a hole-injection layer, and a hole-transport layer between a pixel electrode and a first electrode. At this time, the light-emitting element preferably includes one or more of the first electrode, the electron-injection layer, the electron-transport layer, the hole-injection layer, and the hole-transport layer.

In the display device, the light-blocking layer is preferably positioned between the light-emitting and light-receiving element and the light-emitting element in the plan view. In addition, in the plan view, it is preferable that the light-blocking layer not overlap with the light-emitting region of the light-emitting element and a space be provided between an end portion of the light-blocking layer and an end portion of the light-emitting region.

Furthermore, in the above, a first substrate and a second substrate are preferably included. At this time, the first substrate and the second substrate are provided to face each other. The light-emitting and light-receiving element and the color filter are provided between the first substrate and the second substrate. It is preferable that the first substrate be provided with the light-emitting and light-receiving element and the second substrate be provided with the color filter.

In addition, in the above, a functional layer is preferably included. At this time, the functional layer is preferably provided on and in contact with a surface of the second substrate opposite to a surface where the color filter is provided. The functional layer preferably has a low refractive index than the second substrate.

Furthermore, in the above, when a distance between the light-emitting and light-receiving element and the second substrate is T1 and a minimum width of the light-emitting and light-receiving region of the light-emitting and light-receiving element is W1, T1 is preferably greater than or equal to 0.1 times and less than or equal to 10 times as large as W1.

Moreover, in the above, when the thickness of the second substrate is T2, T2 is preferably greater than or equal to 5 times and less than or equal to 100 times as large as T1.

Another embodiment of the present invention is a display module including any of the above-described display devices, and a connector or an integrated circuit.

Another embodiment of the present invention is an electronic device including the above display module and at least one of an antenna, a battery, a housing, a camera, a speaker, a microphone, a touch sensor, and an operation button.

Effect of the Invention

According to one embodiment of the present invention, a display device with an image capturing function can be provided. Alternatively, an imaging device or a display device that is capable of clearly capturing an image of a fingerprint or the like can be provided. Alternatively, a display device with improved viewing angle characteristics can be provided. Alternatively, a display device with both high viewing angle characteristics and high image capturing performance can be provided. Alternatively, an imaging device or a display device that is capable of capturing an image with high sensitivity can be provided Alternatively, a display device that functions as a touch panel can be provided.

According to one embodiment of the present invention, the number of components of an electronic device can be reduced. Alternatively, a multifunctional display device can be provided. Alternatively, a display device, an imaging device, an electronic device, or the like that has a novel structure can be provided. Alternatively, at least one of problems of the conventional technique can be reduced.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 12A to FIG. 12E are cross-sectional views illustrating examples of a light-emitting and light-receiving element.

MODE FOR CARRYING OUT THE INVENTION

Figure 1A:
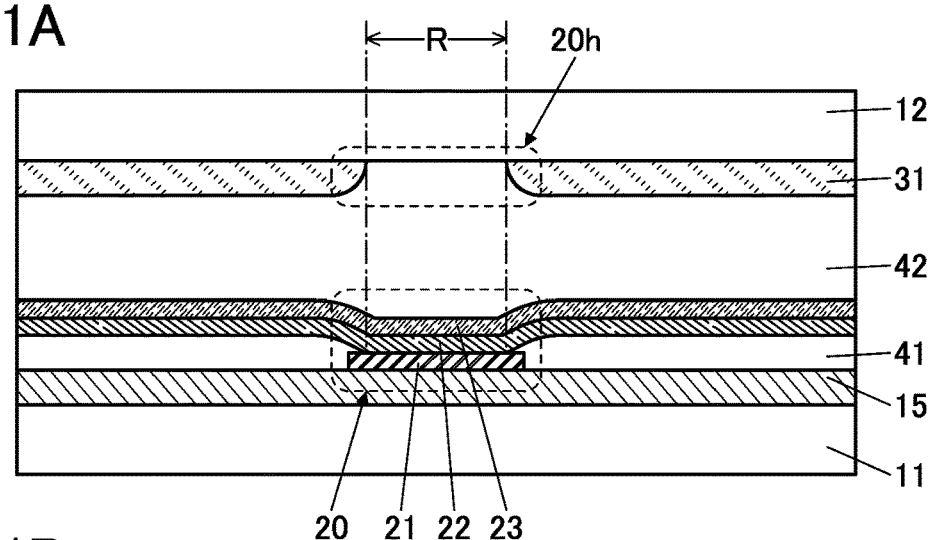
FIG. 1A to FIG. 1C are cross-sectional views illustrating an example of a display device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

Note that in this specification, an EL layer means a layer containing at least a light-emitting substance (also referred to as a light-emitting layer) or a stacked body including the light-emitting layer provided between a pair of electrodes of a light-emitting element.

Furthermore, in this specification, a photoelectric conversion layer refers to at least an active layer or a stacked-layer body including an active layer that is provided between a pair of electrodes of a light-receiving element. An active layer refers to a layer having a function of generating electron-hole pairs by absorbing light. Note that an active layer includes a single layer and a stacked-layer body.

Embodiment 1

In this embodiment, structure examples of a display device of one embodiment of the present invention are described.

One embodiment of the present invention is a display device including a plurality of pixels arranged in a matrix. The pixel includes one or more light-emitting and light-receiving elements.

A light-emitting and light-receiving element (also referred to as a light-emitting and light-receiving device) is an element having a function of a light-emitting element (also referred to as a light-emitting device) that emits light of the first color, and a function of a photoelectric conversion element (also referred to as a photoelectric conversion device) that receives light of the second color. The light-emitting and light-receiving element can also be referred to as a multifunctional element, a multifunctional diode, a light-emitting photodiode, a bidirectional photodiode, or the like.

The plurality of pixels including light-emitting and light-receiving elements are arranged in a matrix, whereby the display device can have a function of displaying images and a function of capturing images. Thus, the display device of one embodiment of the present invention can also be referred to as a complex device or a multifunctional device.

In the case where an image is displayed with a plurality of light-emitting and light-receiving elements, the angle dependence of luminance and chromaticity of light emitted from one light-emitting and light-receiving element is preferably smaller, in which case the viewing angle characteristics of the display device become higher. In contrast, in the case where light from a wide range is incident on one light-emitting and light-receiving element at the time when an image is captured with a plurality of light-emitting and light-receiving elements, blur occurs in the image, making it difficult to obtain a clear image. That is, it is preferable that only light from a direction perpendicular to the surface of the light-emitting and light-receiving element be incident on the light-emitting and light-receiving element whenever possible.

However, when the angle range of light that can be incident on the light-emitting and light-receiving element is narrowed, light in an oblique direction among light emitted from the light-emitting and light-receiving element cannot be extracted, resulting in a decrease of the viewing angle characteristics. In contrast, when the angle range of the light emitted from the light-emitting and light-receiving element is widened, light from a wide angle range is incident on the light-emitting and light-receiving element, so that a clear image is difficult to obtain. Therefore, in the case of a structure where both image capturing and image displaying are performed with the light-emitting and light-receiving element, it is difficult to achieve both favorable viewing angle characteristics and capturing of a clear image.

Thus, in one embodiment of the present invention, a color filter that transmits light of the first color emitted by the light-emitting and light-receiving element and blocks light of the second color received by the light-emitting and light-receiving element is provided above the light-emitting and light-receiving element (i.e., on a display surface side and a light-receiving surface side of the display device). Furthermore, the color filter is provided with an opening portion overlapping with a light-emitting and light-receiving region of the light-emitting and light-receiving element. Accordingly, among the light of the first color emitted by the light-emitting and light-receiving element, light in a direction substantially perpendicular to the surface of the light-emitting and light-receiving element passes through the opening portion of the color filter and light in an oblique direction is emitted to the outside through the color filter. Therefore, the display device can display an image with excellent viewing angle characteristics. When light is received by the light-emitting and light-receiving element, incident light from an oblique direction for the surface of the light-emitting and light-receiving element is blocked by the color filter, and thus, only light from a direction substantially perpendicular to the surface is incident on the light-emitting and light-receiving element. Consequently, a clear image can be captured.

More specific structure examples are described below with reference to drawings.

Structure Example 1

FIG. 1A is a cross-sectional schematic view of a display device 10 of one embodiment of the present invention. The display device 10 includes a light-emitting and light-receiving element 20 and a color filter 31 between a substrate 11 and a substrate 12 that are provided to face each other.

An element layer 15 is provided over the substrate 11. The element layer 15 is a layer including a circuit for driving the light-emitting and light-receiving element 20, a wiring, or the like. For example, the element layer 15 includes a transistor, a capacitor, a resistor, a wiring, an electrode, and the like.

The light-emitting and light-receiving element 20 has a structure in which a conductive layer 21, an organic layer 22, and a conductive layer 23 are stacked. The conductive layer 21 functions as a pixel electrode and is electrically connected to a circuit in the element layer 15. The conductive layer 21 preferably has a reflecting property with respect to light emitted by the light-emitting and light-receiving element 20 and light received by the light-emitting and light-receiving element 20. The organic layer 22 includes at least an EL layer and a photoelectric conversion layer. The conductive layer 23 functions as a common electrode. The conductive layer 23 preferably has a light-transmitting property with respect to light emitted by the light-emitting and light-receiving element 20 and light received by the light-emitting and light-receiving element 20.

The light-emitting and light-receiving element 20 has a function of emitting light 30R of the first color and a function of receiving light 30G of the second color. It is desirable that the light 30R be light having a longer wavelength than the light 30G. Accordingly, the light 30R emitted by the light-emitting and light-receiving element 20 can be prevented from being absorbed by the photoelectric conversion layer included in the light-emitting and light-receiving element 20, whereby a decrease in the emission efficiency of the light-emitting and light-receiving element 20 can be inhibited. For example, an element that has a function of emitting red light and receives light having shorter wavelengths than red light (e.g., green light, blue light, or light of both colors) can be used as the light-emitting and light-receiving element 20. Note that one or both of light emitted by the light-emitting and light-receiving element 20 and light received by the light-emitting and light-receiving element 20 are not limited to visible light and may be infrared light or ultraviolet light.

An insulating layer 41 that covers an end portion of the conductive layer 21 and the element layer 15 is provided. The organic layer 22 is provided to cover the top surface of the insulating layer 41 and the top surface of the conductive layer 21. The conductive layer 23 is provided to cover the organic layer 22. In a region surrounded by the insulating layer 41 over the conductive layer 21, the conductive layer 21 and the organic layer 22 are provided in contact with each other. Since the region contributes to light emission and light reception of the light-emitting and light-receiving element 20, the region is referred to as a light-emitting and light-receiving region R.

An adhesive layer 42 is provided over the conductive layer 23. The adhesive layer 42 has a function of bonding the substrate 11 and the substrate 12 to each other. The adhesive layer 42 may function as a sealing layer that seals the light-emitting and light-receiving element 20.

A surface of the substrate 12 on the light-emitting and light-receiving element 20 side is provided with the color filter 31. The color filter 31 has a function of transmitting light emitted by the light-emitting and light-receiving element 20 (the light 30R of the first color) and blocking light received by the light-emitting and light-receiving element 20 (the light 30G of the second color). The color filter 31 may have a function of reflecting the light 30G of the second color; however, it is further preferable that the color filter 31 have a function of absorbing the light 30G of the second color.

Furthermore, the color filter 31 includes an opening portion 20h overlapping with the light-emitting and light-receiving element 20. The opening portion 20h included in the color filter 31 is provided so as to overlap with the light-emitting and light-receiving region R of the light-emitting and light-receiving element 20 in the plan view. Moreover, the color filter 31 includes a portion that does not overlap with the light-emitting and light-receiving element 20 in the plan view.

Here, in this specification and the like, the plan view refers to a view from the display surface side and the light-receiving surface side of the display device 10 (e.g., an outer surface of the substrate 12). Specifically, a view from a normal direction of a surface of the substrate 12 opposite to the surface provided with the color filter 31 is referred to as the plan view.

Figure 1B:
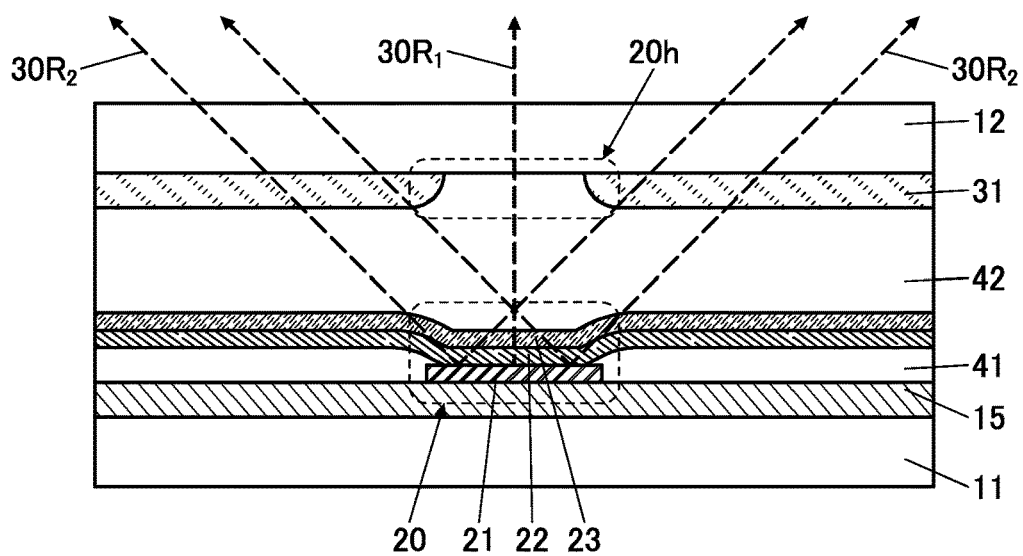

FIG. 1B schematically illustrates a state where the light-emitting and light-receiving element 20 emits light. As illustrated in FIG. 1B, light $30R_1$ emitted in a substantially upward direction from the light-emitting and light-receiving element 20 is emitted to the outside through the opening portion 20h of the color filter 31. Meanwhile, light $30R_2$ emitted in an oblique direction from the light-emitting and light-receiving element 20 is transmitted through the color filter 31 and emitted to the outside. Accordingly, light is emitted from the light-emitting and light-receiving element 20 in a wide angle range.

Here, the wavelength of light emitted in the direction perpendicular to the light emission surface of the light-emitting and light-receiving element 20 is sometimes deviated from the wavelength of light emitted in the oblique direction. In that case, chromaticity deviation might be perceived when seen from the oblique direction. However, as for the display device 10, even when the light-emitting and light-receiving element 20 with such characteristics is used, the color purity is enhanced because the light emitted in the oblique direction is transmitted through the color filter 31, so that a secondary effect can be obtained, i.e., chromaticity deviation due to a difference in viewing angle is less likely to be perceived.

Figure 1C:
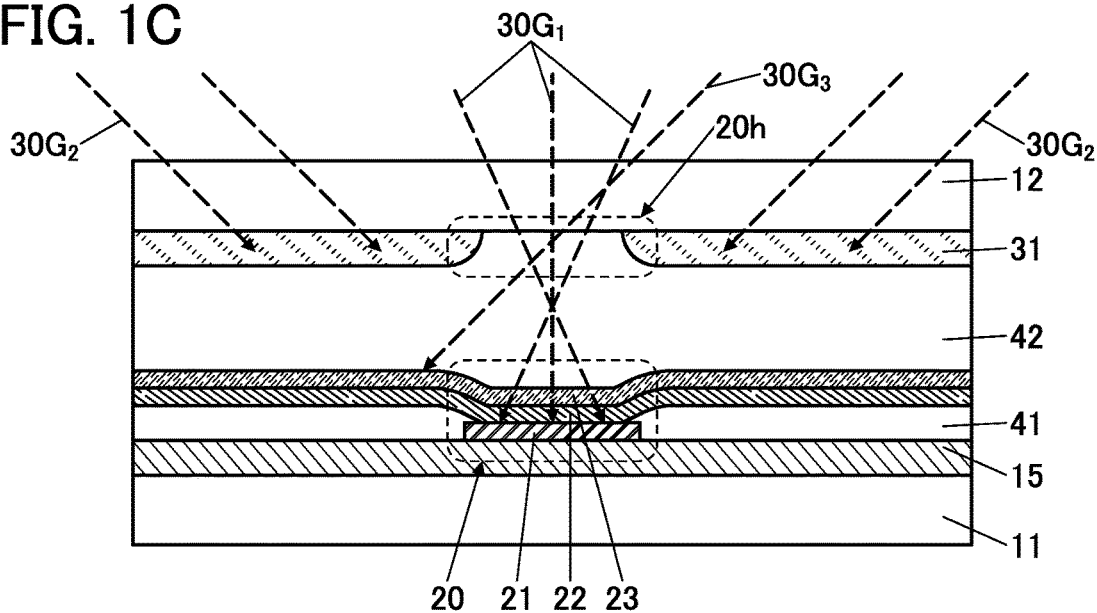

FIG. 1C schematically illustrates a state where light from the outside is incident on the light-emitting and light-receiving element 20. As illustrated in FIG. 1C, light $30G_1$ incident from a direction substantially perpendicular to the light-emitting and light-receiving element 20 reaches the light-emitting and light-receiving element 20 through the opening portion 20h of the color filter 31. Meanwhile, light $30G_2$ incident from an oblique direction is blocked (absorbed or reflected) by the color filter 31 and does not reach the light-emitting and light-receiving element 20. Furthermore, even as for the light passing through the opening portion 20h of the color filter 31, light with a large incident angle (i.e., incident light from an oblique direction for the surface of the substrate 12), e.g., light $30G_3$, does not reach the light-emitting and light-receiving element 20 and thus is not contribute to light reception of the light-emitting and light-receiving element 20. Accordingly, only incident light from a substantially perpendicular direction is received by the light-emitting and light-receiving element 20. Therefore, a clear image with less blur can be captured.

As the distance between the color filter 31 and the light-emitting and light-receiving element 20 is increased, a range in which light can be incident on the light-emitting and light-receiving element 20 can be narrowed, which makes it possible to capture a clear image.

Structure Example 2

Figure 2A:
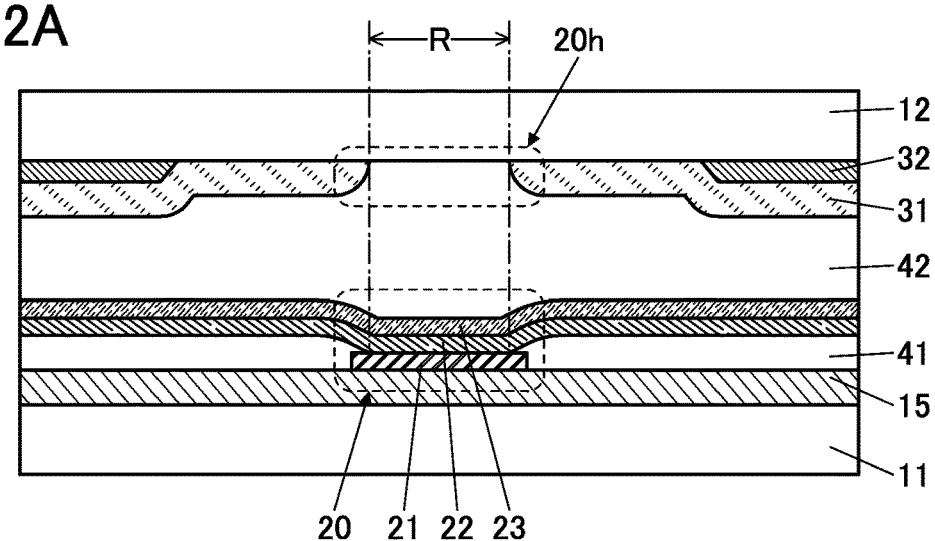
FIG. 2A to FIG. 2C are cross-sectional views illustrating an example of a display device.

FIG. 2A illustrates a schematic cross-sectional view of a display device 10a whose structure is partly different from that of the display device 10. The display device 10a is different from the display device 10 mainly in including a light-blocking layer 32.

The light-blocking layer 32 is provided on a side of the substrate 12 that faces the substrate 11. FIG. 2A illustrates an example in which the light-blocking layer 32 is provided between the substrate 12 and the color filter 31. Note that the color filter 31 may be positioned between the light-blocking layer 32 and the substrate 12.

The light-blocking layer 32 can block (absorb or reflect) both light of the first color emitted by the light-emitting and light-receiving element 20 and light of the second color received by the light-emitting and light-receiving element 20. It is particularly preferable to use a material absorbing visible light, for the light-blocking layer 32. For the light-blocking layer 32, a black matrix formed using a metal material or a resin material containing pigment (e.g., carbon black) or dye can be used, for example. Alternatively, for the light-blocking layer 32, a stacked-layer body in which two or more of a red color filter, a green color filter, and a blue color filter are stacked may be used.

The light-blocking layer 32 is positioned on the outer side than the opening portion 20h of the color filter 31 in the plan view. In other words, in the plan view, the opening portion 20h of the color filter 31 is positioned on the inner side than a pair of end portions of the light-blocking layer 32 between which the light-emitting and light-receiving element 20 is sandwiched. At this time, in the plan view, the color filter 31 includes a portion that overlaps with the light-blocking layer 32 and a portion that is positioned between the opening portion 20h and the light-blocking layer 32 and overlaps with neither the light-blocking layer 32 nor the light-emitting and light-receiving element 20.

Figure 2B:
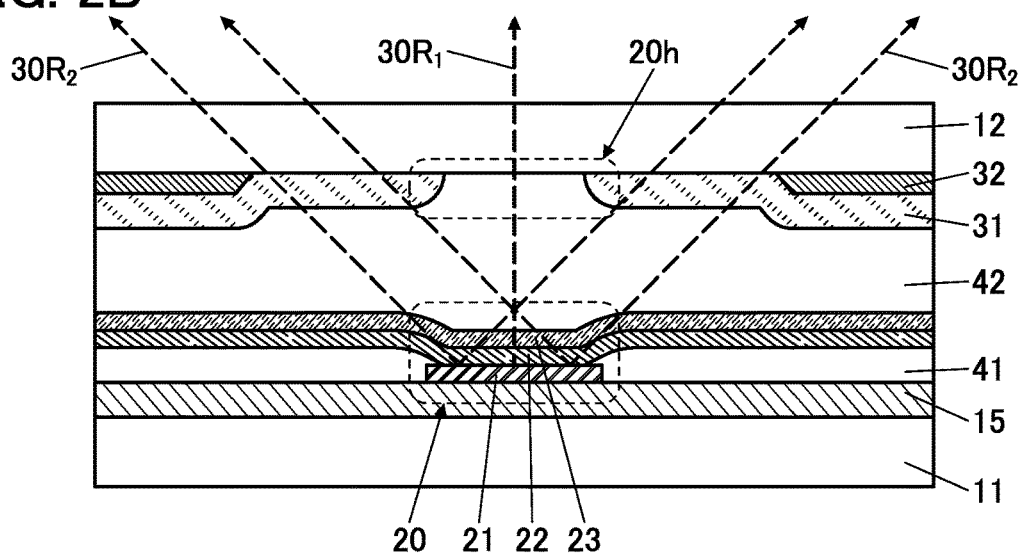

FIG. 2B schematically illustrates a state where the light-emitting and light-receiving element 20 emits light. The light $30R_2$ emitted in an oblique direction from the light-emitting and light-receiving element 20 is transmitted through the color filter 31 and emitted to the outside, on the inner side than the light-blocking layer 32. As the distance between the pair of end portions of the light-blocking layer 32 is increased, i.e., a region not overlapping with the light-blocking layer 32 of the color filter 31 is widened, light can be emitted from the light-emitting and light-receiving element 20 in a wider angle range.

Figure 2C:
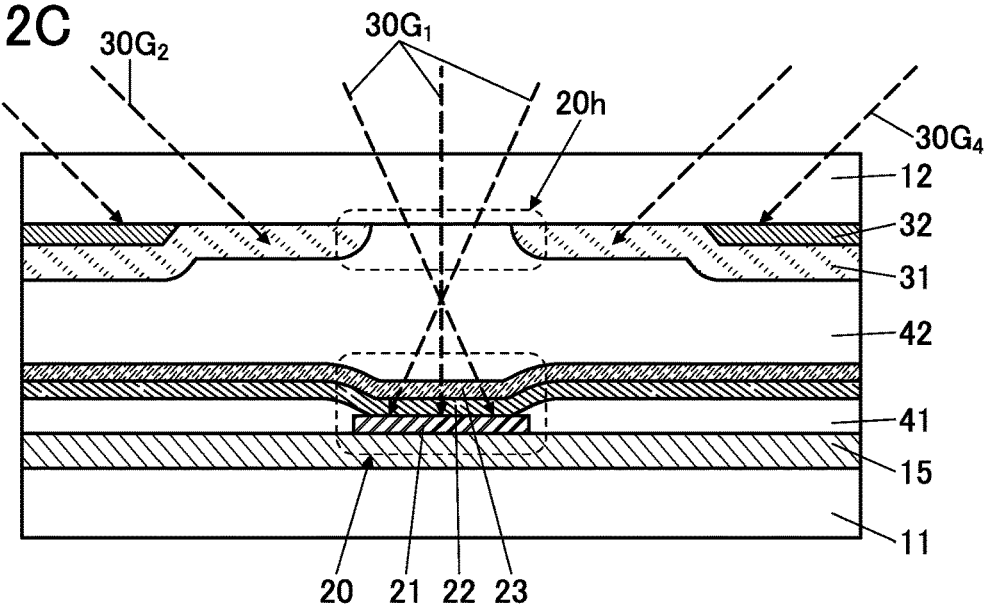

FIG. 2C illustrates a state where light from the outside is incident on the light-emitting and light-receiving element 20. Among light incident from an oblique direction for the light-emitting and light-receiving element 20, the light $30G_2$ reaching the color filter 31 is blocked by the color filter 31 and does not reach the light-emitting and light-receiving element 20. Light $30G_4$ reaching the light-blocking layer 32 is blocked (absorbed or reflected) by the light-blocking layer 32 and does not reach the light-emitting and light-receiving element 20.

Providing the light-blocking layer 32 makes it possible to reduce the amount of light that can be transmitted through the color filter 31 and incident on the light-emitting and light-receiving element 20. Furthermore, not only incident light from the outside of the display device 10a but also part of light scattered (guided) in the inside of the display device 10a, e.g., in the adhesive layer 42 (such light is also referred to as stray light) can be absorbed by the light-blocking layer 32. Accordingly, unnecessary light that can be incident on the light-emitting and light-receiving element 20 can be reduced, so that noise can be reduced and a clear image can be captured.

Modification Example

Although FIG. 1A and FIG. 2A each illustrate the example in which the width of the opening portion 20h of the color filter 31 is substantially the same as the width of the light-emitting and light-receiving region R of the light-emitting and light-receiving element 20, the structure is not limited thereto.

Figure 3A:
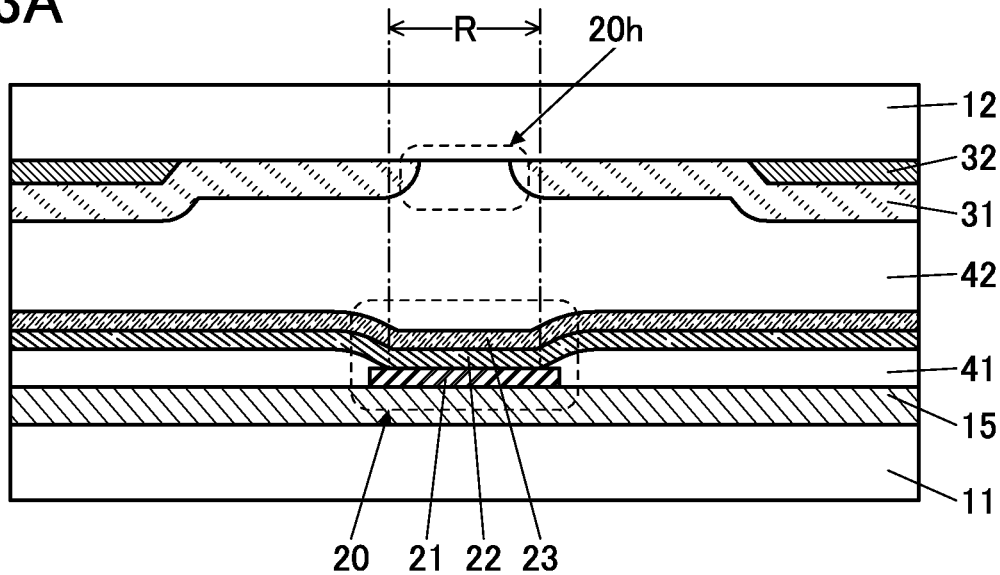
FIG. 3A and FIG. 3B are cross-sectional views illustrating examples of a display device.

In a display device 10b illustrated in FIG. 3A, the opening portion 20h of the color filter 31 is positioned on the inner side than the light-emitting and light-receiving region R of the light-emitting and light-receiving element 20.

Here, the light-emitting and light-receiving region R of the light-emitting and light-receiving element 20 is a region positioned over the conductive layer 21 and surrounded by end portions of the insulating layer 41. In other words, a region where the conductive layer 21 is in contact with the organic layer 22 can also be referred to as the light-emitting and light-receiving region R.

The color filter 31 included in the display device 10b includes a portion overlapping with the outer edge portion of the light-emitting and light-receiving region R of the light-emitting and light-receiving element 20 in the plan view. Accordingly, the opening portion 20h of the color filter 31 is made smaller, so that light that is from the outside and to be applied to the light-emitting and light-receiving element 20 can be further reduced. Therefore, light incident from an oblique direction for the light-emitting and light-receiving element 20 can be effectively blocked, whereby a clearer image can be obtained. Note that the outer edge portion of a certain region refers to a region including the end portion (also referred to as the outline or the outer periphery portion) of the region and part of the region along the end portion.

Figure 3B:
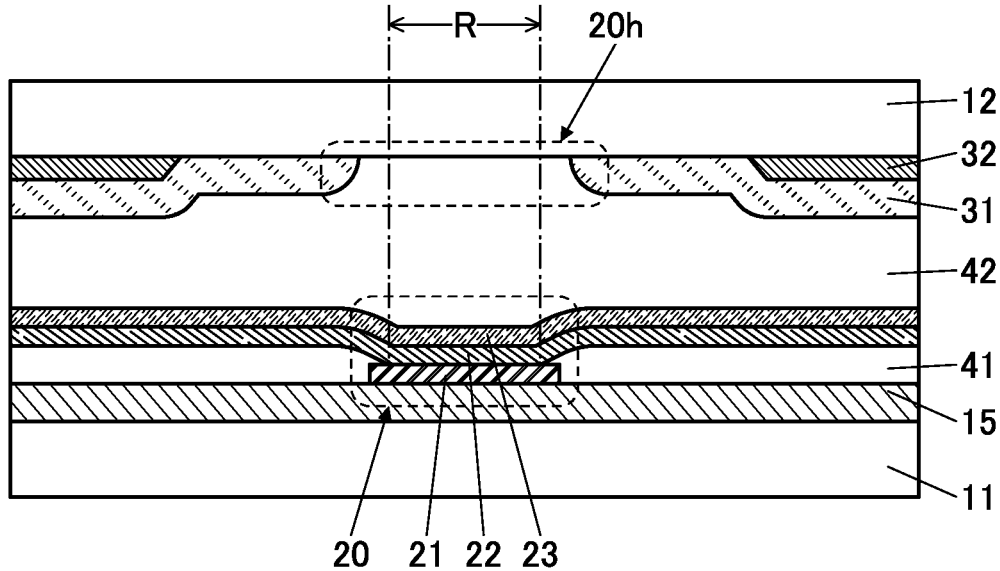

FIG. 3B illustrates a schematic cross-sectional view of a display device 10c in which the light-emitting and light-receiving region R is positioned on the inner side than the opening portion 20h of the color filter 31 in the plan view.

In the display device 10c, the end portion of the light-emitting and light-receiving region R is positioned in the inside of the opening portion 20h in the plan view. Furthermore, in the plan view, a region (space) where neither the light-emitting and light-receiving region R nor the color filter 31 is provided is provided between the light-emitting and light-receiving region R and the color filter 31.

Such a structure can increase the amount of light emitted from the light-emitting and light-receiving element 20 to the outside through the opening portion 20h of the color filter 31. Accordingly, viewability from a front direction can be enhanced. In addition, since the width of the opening portion 20h of the color filter 31 is larger than the width of the light-emitting and light-receiving region R, the amount of light incident on the light-emitting and light-receiving element 20 can be increased, whereby the sensitivity of the light-emitting and light-receiving element 20 in image capturing can be enhanced.

Although the examples each including the light-blocking layer 32 are described as the display device 10b and the display device 10c, a structure not including the light-blocking layer 32, like the display device 10, may be employed.

Structure Example 3

Next, a more specific structure example of the display device of one embodiment of the present invention is described with reference to FIG. 4.

Figure 4:
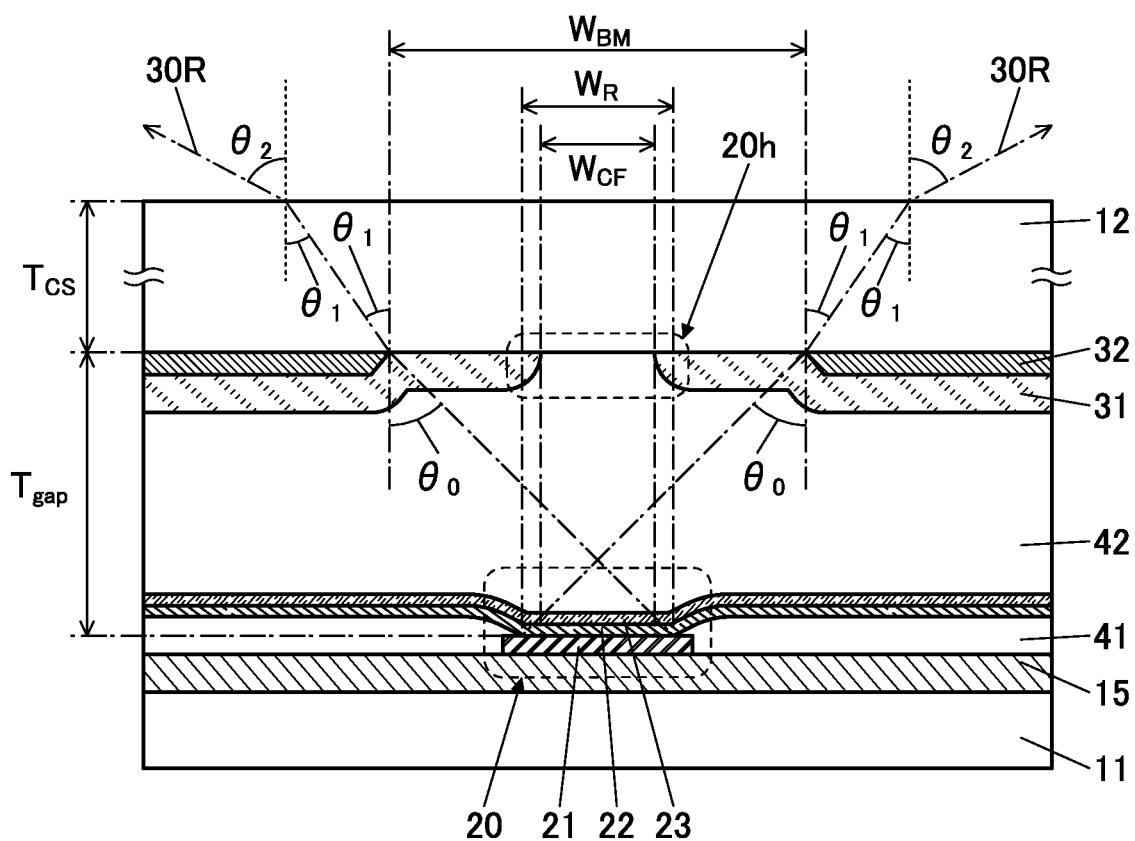
FIG. 4 is a cross-sectional view illustrating an example of a display device.

As illustrated in FIG. 4, the thickness of the substrate 12 is referred to as $T_{CS}$. The distance from the top surface of the conductive layer 21 of the light-emitting and light-receiving element 20 to a surface of the substrate 12 on the substrate 11 side is referred to as $T_{gap}$. Here, the light-blocking layer 32 is assumed to be provided in contact with the surface of the substrate 12 on the substrate 11 side.

The width of the opening portion 20h of the color filter 31 in the cross-sectional view is referred to as $W_{CF}$. $W_{CF}$ is the distance between a pair of end portions of the color filter 31 that face each other. The width of the light-emitting and light-receiving region of the light-emitting and light-receiving element 20 is referred to as $W_R$. Here, an example in which $W_R$ is larger than $W_{CF}$ is illustrated. The distance between the pair of end portions of the light-blocking layer 32 that face each other (also referred to as an opening width of the light-blocking layer 32) is referred to as $W_{BM}$. $W_{BM}$ is preferably larger than both $W_{CF}$ and $W_R$.

Here, the opening width $W_{BM}$ of the light-blocking layer 32 is particularly important because it has an influence on the viewing angle characteristics of an image to be displayed. When the opening width $W_{BM}$ is too small, light emitted in an oblique direction from the light-emitting and light-receiving element 20 is blocked, so that the display device has a narrow viewing angle. In contrast, when the opening width $W_{BM}$ of the light-blocking layer 32 is too large, an area occupied by one pixel becomes large, whereby an increase in the resolution is made difficult.

In FIG. 4, the optical path of the light 30R emitted in an oblique direction from an end portion of the light-emitting and light-receiving region of the light-emitting and light-receiving element 20 is schematically denoted with an arrow of dashed-dotted line. Note that here, for convenience, light refraction between the light-emitting and light-receiving element 20 and the adhesive layer 42 and refraction between the adhesive layer 42 and the color filter 31 are not taken into account in the drawing.

Here, among the light 30R emitted from the light-emitting and light-receiving element 20 and incident on the substrate 12, the light 30R in the vicinity of the end portion of the light-blocking layer 32 has the largest incident angle with respect to the substrate 12. Here, the maximum value of the incident angle is represented by $\theta_0$ and the refractive angle at this time is represented by $\theta_1$. At this time, an incident angle of light emitted from the substrate 12 to the outside (the air) is also $\theta_1$. Furthermore, a refractive angle of the light emitted from the substrate 12 to the outside is represented by $\theta_2$.

When the refractive index of the substrate 12 is $n_{CS}$ and the refractive index of the outside is 1, the critical angle of the angle $\theta_1$ at the interface between the substrate 12 and the outside is an angle satisfying $\sin \theta_1 = 1/n_{CS}$. For example, a critical angle at $n_{CS}$ of 1.5 is approximately 41.81°, a critical angle at $n_{CS}$ of 1.45 is approximately 43.60°, and a critical angle at $n_{CS}$ of 1.40 is approximately 45.58°.

Here, as the refractive angle 22 of the light emitted from the substrate 12 to the outside is closer to 90°, the viewing angle of the display device becomes closer to 180°; thus, the display device can have excellent viewing angle characteristics. Accordingly, it is preferable that the opening width $W_{BM}$ of the light-blocking layer 32, the width $W_R$ of the light-emitting and light-receiving region, and the distance $T_{gap}$ be set so that $n_{CS} \times \sin \theta_1$, where $n_{CS}$ is the refractive index of the substrate 12 and $\theta_1$ is the largest incident angle of the light incident on the substrate 12, can be greater than or equal to 0.8 and less than or equal to 1.2, preferably greater than or equal to 0.9 and less than or equal to 1.1, preferably greater than or equal to 0.95 and less than or equal to 1.0. For example, they are preferably designed so that $\theta_1$ can be greater than or equal to 41° and less than or equal to 48°, preferably greater than or equal to 42° and less than or equal to 46°, typically the neighborhood of 45°.

A larger distance $T_{gap}$ is preferable because light incident from an oblique light among the light incident on the light-emitting and light-receiving element 20 from the outside can be blocked more efficiently and capturing of a clearer image becomes possible. The distance $T_{gap}$ is preferably set to be greater than or equal to 0.1 times and less than or equal to 10 times, preferably greater than or equal to 0.5 times and less than or equal to 5 times, further preferably greater than or equal to 0.6 times and less than or equal to 4 times, still further preferably greater than or equal to 0.7 times and less than or equal to 3 times as large as the width $W_R$ of the light-emitting and light-receiving region of the light-emitting and light-receiving element 20. Here, although the value of the width $W_R$ of the light-emitting and light-receiving region varies depending on the top surface shape of the light-emitting and light-receiving element 20 and the direction of the cross section, the smallest value thereof can be the width $W_R$.

As the thickness $T_{CS}$ of the substrate 12 becomes larger, the mechanical strength of the display device on the display surface side can be more enhanced. In contrast, with the substrate 12 being too thick, the distance between a subject to be captured and the light-emitting and light-receiving element 20 is large even when the subject to be captured is placed in contact with the display surface; accordingly, the image-capturing range of one light-emitting and light-receiving element 20 might be widened, so that a clear image cannot be obtained. Thus, the distance $T_{gap}$ is increased, whereby a clear image becomes easy to obtain even in the case where the thickness $T_{CS}$ of the substrate 12 is large. Therefore, the thickness $T_{CS}$ is preferably greater than or equal to 1 time and less than or equal to 200 times, preferably greater than or equal to 5 times and less than or equal to 100 times, further preferably greater than or equal to 10 times and less than or equal to 80 times, still further preferably greater than or equal to 10 times and less than or equal to 50 times as large as the distance $T_{gap}$.

Structure Example 4

The display device of one embodiment of the present invention can capture a clear image of a subject in contact with the display surface. For example, an image of a fingerprint, a palm print, or the like can be favorably captured. When a subject to be captured is placed on the display surface and then image capturing is performed, the display device can be used as an image scanner. Furthermore, the positional information or information on the shape of the subject in contact with the display surface is obtained, in which case a function of a touch panel can be achieved.

Figure 5A:
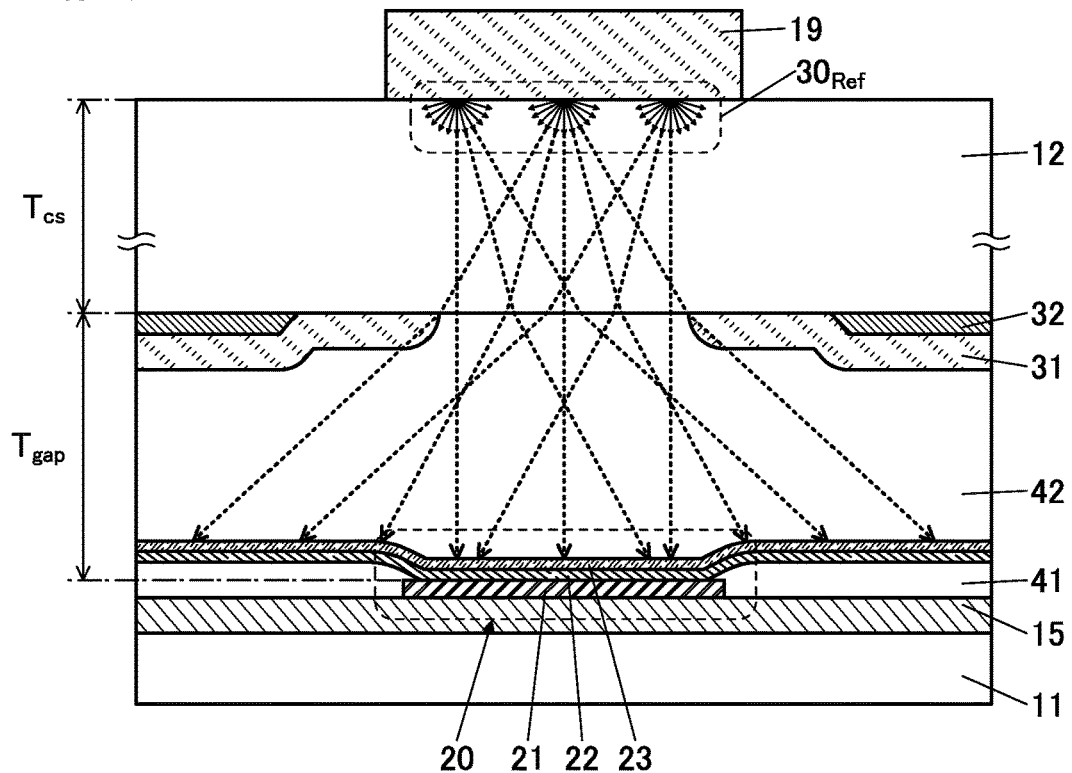
FIG. 5A and FIG. 5B are cross-sectional views illustrating examples of a display device.

FIG. 5A illustrates a state where a scatterer 19 is in contact with the top surface of the substrate 12. A variety of objects that can be subjects to be captured, such as a finger, a palm, a stylus pen, and a printed matter can be given as examples of the scatterer 19. An object that scatters light on its surface is preferable as the scatterer 19. With light incident on the surface of the scatterer 19 and the vicinity thereof, scattering occurs. For example, scattered light from a printed matter, the tip of a stylus pen, or the like has small angle dependence and exhibits isotropic intensity distribution. Similarly, scattered light that is scattered at a surface of a skin, such as a finger or a palm, also exhibits isotropic intensity distribution. In FIG. 5A, scattered light $30_{Ref}$ from a plurality of points in the scatterer 19 is denoted by arrows.

In FIG. 5A, optical paths of some light passing through the opening portion of the color filter 31 among the scattered light $30_{Ref}$ in various direction are denoted by arrows of dotted lines.

As illustrated in FIG. 5A, light that travels in a direction substantially perpendicular to a contact surface between the scatterer 19 and the substrate 12 reaches the light-emitting and light-receiving element 20 because the light is less likely to be influenced by refraction. Meanwhile, light that travels in an oblique direction for the contact surface is refracted, for example, at an interface between the substrate 12 and the adhesive layer 42, and therefore the light does not reach the light-emitting and light-receiving element 20 in some cases. That is, even when the scatterer 19 is positioned just above the light-emitting and light-receiving element 20, all the scattered light $30_{Ref}$ of the scatterer 19 is not received by the light-emitting and light-receiving element 20 but only some of the light is received by the light-emitting and light-receiving element 20. In particular, in the case where the thickness $T_{CS}$ of the substrate 12, the distance $T_{gap}$ between the substrate 12 and the light-emitting and light-receiving element 20, or the like is large, the intensity of the scattered light $30_{Ref}$ that can be received by the light-emitting and light-receiving element 20 is more significantly reduced.

Figure 5B:
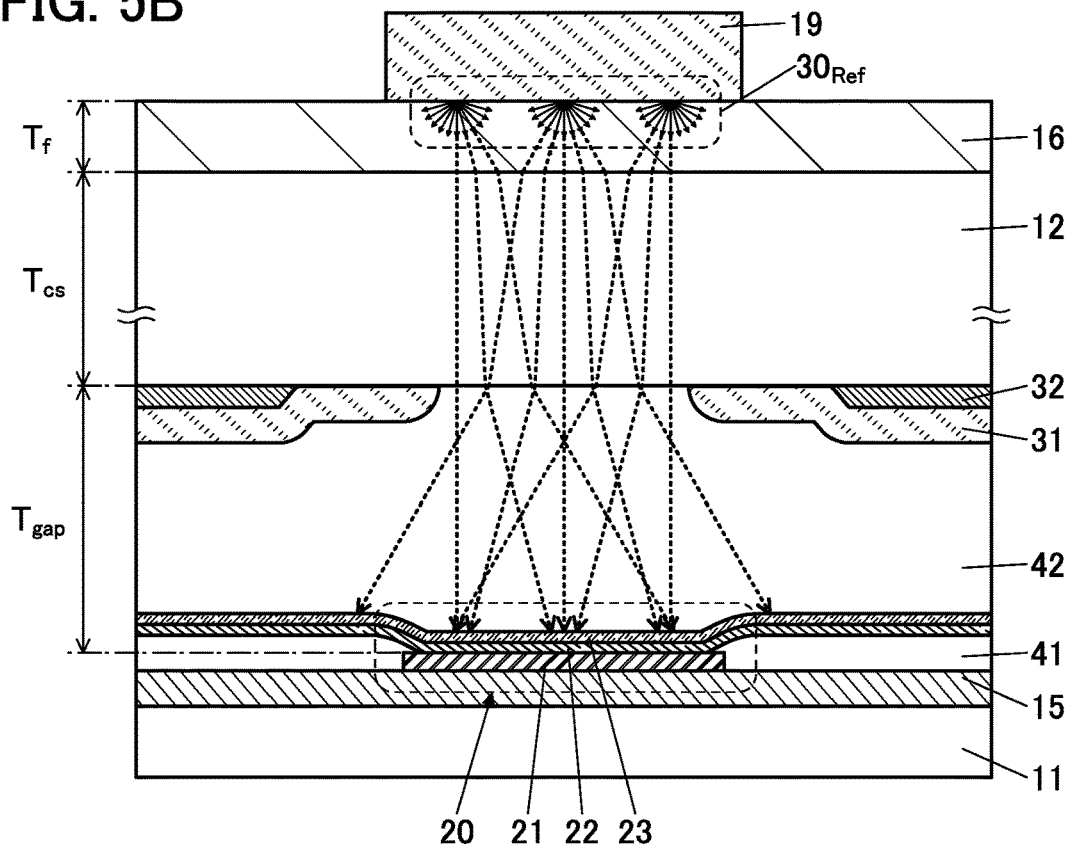

Therefore, it is preferable that the surface of the substrate 12 be provided with a functional layer 16 as illustrated in FIG. 5B. The functional layer 16 has a light-transmitting property and has a lower refractive index than the substrate 12. For the functional layer 16, a resin, an inorganic film (including an oxide film and a nitride film), a metal film, glass with a low refractive index, or the like can be used, for example. The functional layer 16 may be a thin film deposited on the surface of the substrate 12, a coating agent, or a film-like, sheet-like, or plate-like component bonded to the surface of the substrate 12.

In the case where a resin is used for the functional layer 16, for example, fluoropolymer such as polytetrafluoroethylene, chlorotrifluoroethylen, polyvinylidene fluoride, or polyvinyl fluoride, or a material containing fluoropolymer copolymer such as a perfluoroalkoxy fluoropolymer is preferably used because a scratch-resistance property, an anti-fouling property, a lubricating property, or the like of the surface of the substrate 12 can be increased. Alternatively, a siloxane-based resin such as organic polysiloxane with a low refractive index may be used. Here, the siloxane-based resin corresponds to a resin including a Si—O—Si bond formed using a siloxane-based material as a starting material. In the siloxane-based resin, an organic group (e.g., an alkyl group or an aryl group), a fluoro group, or the like may be used as a substituent. In addition, the organic group may include a fluoro group.

An effect by the functional layer 16 provided between the substrate 12 and the scatterer 19 is described. As illustrated in FIG. 5B, light scattered at the surface of the scatterer 19 is refracted at the interface between the functional layer 16 and the substrate 12. Since the substrate 12 has a higher refractive index than the functional layer 16 at this time, the light is refracted so that the direction of the light is close to a direction perpendicular to the surface of the substrate 12. Then, the light is refracted again at the interface between the substrate 12 and the adhesive layer 42 to reach the substrate 11 side. In this manner, light is refracted at the interface between the functional layer 16 and the substrate 12, whereby light can be condensed. As a result, the amount of light reaching the light-emitting and light-receiving element 20 can be increased as illustrated in FIG. 5B.

Here, a thickness $T_f$ of the functional layer 16 is preferably as small as possible. As the thickness $T_f$ of the functional layer 16 is reduced, the interface between the functional layer 16 and the substrate 12 for light refraction can be closer to the surface of the scatterer 19 (i.e., a scattering surface). Accordingly, the optical path of light traveling in an oblique direction among the scattered light $30_{Ref}$ scattered at the surface of the scatterer 19 can be shortened; therefore, the amount of light reaching the light-emitting and light-receiving element 20 can be further increased.

The thickness $T_f$ of the functional layer 16 can be, for example, less than or equal to 1 mm, preferably less than or equal to 0.5 mm, further preferably less than or equal to 0.3 mm, still further preferably less than or equal to 0.1 mm, yet still further preferably less than or equal to 0.05 mm. The lower limit of the thickness $T_f$ of the functional layer 16 is preferably as small as possible and can be greater than equal to 10 nm, greater than or equal to 50 nm, greater than or equal to 100 nm, greater than or equal to 500 nm, greater than or equal to 1 μm, greater than or equal to 5 μm, or greater than or equal to 10 μm, for example. The above upper limits and lower limits can be combined freely.

Structure Example 5

An example of a display device including a light-emitting and light-receiving element and a light-emitting element is described below. When a light-emitting and light-receiving element that emits light of the first color and receives light of the second color and a light-emitting element that emits light of the second color are provided in a display device, the light-emitting element can be used as a light source for image capturing. Furthermore, when an additional light-emitting element that emits light of the third color is provided in the display device, the display device capable of displaying a full-color image can be achieved.

Figure 6A:
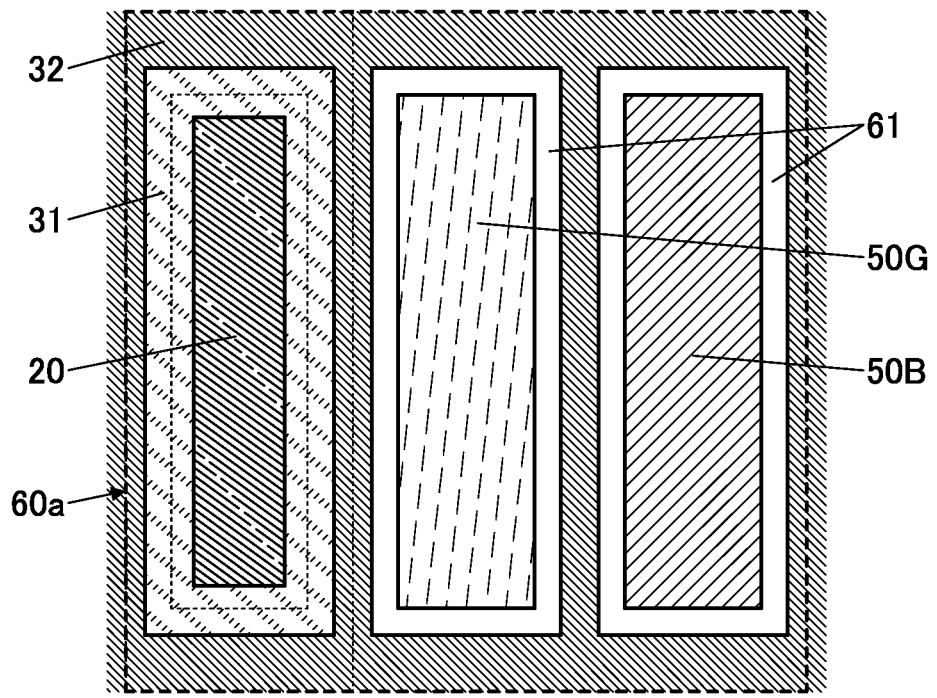
FIG. 6A and FIG. 6B are top views illustrating examples of a display device.

FIG. 6A illustrates a schematic top view of one pixel 60a provided in a display region of the display device. The pixel 60a includes the light-emitting and light-receiving element 20, a light-emitting element 50G, and a light-emitting element 50B. For example, the light-emitting and light-receiving element 20 can be an element that emits red light and receives one or both of green light and blue light. The light-emitting element 50G can be an element that emits green light, and the light-emitting element 50B can be an element that emits blue light.

The pixel 60a illustrated in FIG. 6A is what is called a stripe-arrangement pixel, in which the light-emitting and light-receiving element 20, the light-emitting element 50G, and the light-emitting element 50B are arranged in this order in the horizontal direction. The light-emitting and light-receiving element 20, the light-emitting element 50G, and the light-emitting element 50B each have a substantially rectangular shape and are positioned so that their longitudinal direction are parallel to the vertical direction. In the display region of the display device, a plurality of pixels 60a are arranged in a matrix in vertical and horizontal directions.

The light-blocking layer 32 is provided in FIG. 6A. Here, the light-blocking layer 32 is provided so as to surround the light-emitting and light-receiving element 20, the light-emitting element 50G, and the light-emitting element 50B. In other words, the light-blocking layer 32 includes opening portions overlapping with the light-emitting and light-receiving element 20, the light-emitting element 50G, and the light-emitting element 50B, respectively. The light-emitting and light-receiving element 20, the light-emitting element 50G, and the light-emitting element 50B are each positioned in the inside of the opening portion of the light-blocking layer 32 so as not to overlap with the light-blocking layer 32. In the plan view, a space 61 is provided between the light-emitting element 50G and the light-blocking layer 32 and between the light-emitting element 50B and the light-blocking layer 32.

The color filter 31 is provided so as to overlap with part of the light-emitting and light-receiving element 20. The color filter 31 is provided so as to overlap with the outer edge portion of the light-emitting and light-receiving region of the light-emitting and light-receiving element 20. Other part of the color filter 31 is provided so as to overlap with the light-blocking layer 32. Note that the color filter 31 and the light-emitting and light-receiving region of the light-emitting and light-receiving element 20 may be provided so as not to overlap with each other, as described above. At this time, a space is provided between the end portion of the color filter and the light-emitting and light-receiving region of the light-emitting and light-receiving element 20.

Figure 6B:
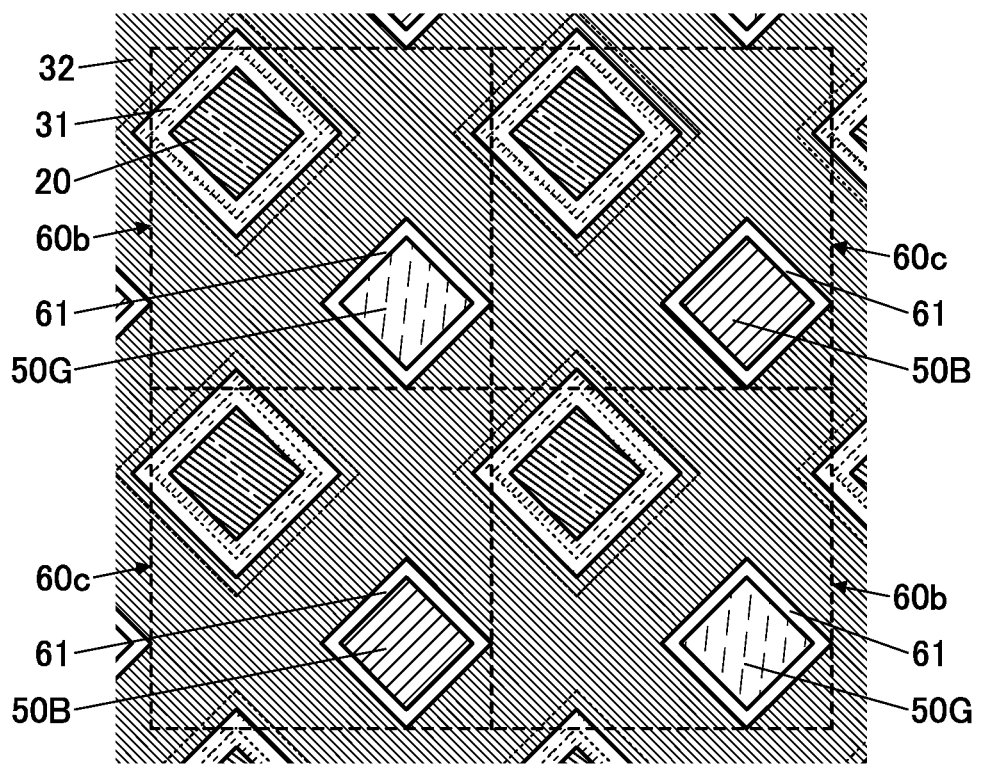

FIG. 6B illustrates a pixel structure different from that described above. In the example illustrated in FIG. 6B, pixels 60b that include the light-emitting and light-receiving elements 20 and the light-emitting elements 50G and pixels 60c that include the light-emitting and light-receiving elements 20 and the light-emitting elements 50B are arranged alternately in the vertical and horizontal directions.

In FIG. 6B, the top surface shapes of the light-emitting and light-receiving element 20, the light-emitting element 50G, and the light-emitting element 50B are substantially square shapes and inclined at 45° with respect to the arrangement direction of the pixels. Accordingly, large spaces can be ensured among the light-emitting and light-receiving element 20, the light-emitting element 50G, and the light-emitting element 50B, so that a high yield can be achieved when thin films constituting the elements are separately formed. Such a structure enables high-density arrangement of pixels, whereby a display device capable of displaying a high-resolution image can be achieved.

Figure 7A:
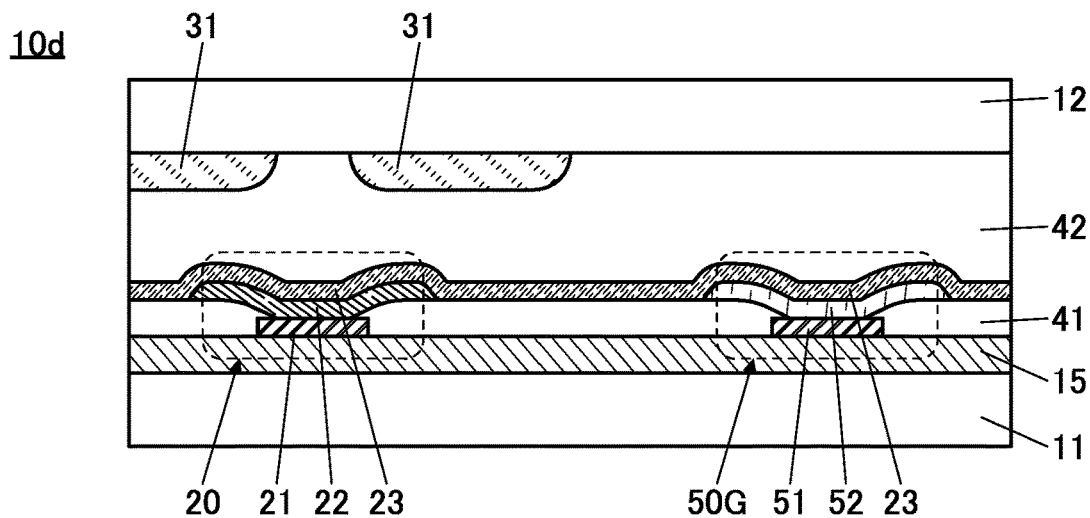
FIG. 7A to FIG. 7C are cross-sectional views illustrating examples of a display device.

FIG. 7A illustrates a schematic cross-sectional view of a display device 10d in the case where the light-emitting and light-receiving element 20 and the light-emitting element 50G are provided side by side. Note that the light-emitting element 50B is omitted here because the light-emitting element 50B can have the same structure as the light-emitting element 50G.

The above description for the display device 10 and the like can be referred to for the structure of the light-emitting and light-receiving element 20.

The light-emitting element 50G includes a conductive layer 51, an organic layer 52, and the conductive layer 23. The conductive layer 51 functions as a pixel electrode and is electrically connected to a circuit in the element layer 15. The conductive layer 51 has a reflective property with respect to light emitted by the light-emitting element 50G. It is preferable that the conductive layer 51 be positioned on the same surface as the conductive layer 21 of the light-emitting and light-receiving element 20 and be formed by processing the same conductive film as the conductive layer 21 of the light-emitting and light-receiving element 20. The organic layer 52 is a layer that includes at least an EL layer. A material of a light-emitting layer in the EL layer included in the organic layer 52 is preferably different from a material of a light-emitting layer in an EL layer included in the organic layer 22 of the light-emitting and light-receiving element 20. The conductive layer 23 is shared by the light-emitting and light-receiving element 20 and the light-emitting element 50G and functions as a common electrode. The conductive layer 23 includes a portion overlapping with the conductive layer 21 with the organic layer 22 therebetween and a portion overlapping with the conductive layer 51 with the organic layer 52 therebetween.

The color filter 31 is provided so as to surround the light-emitting and light-receiving region of the light-emitting and light-receiving element 20 in the plan view. In FIG. 7A, part of the color filter 31 is provided so as to overlap with the light-emitting and light-receiving element 20. In addition, the color filter 31 is not provided in the vicinity of the light-emitting element 50G.

Figure 7B:
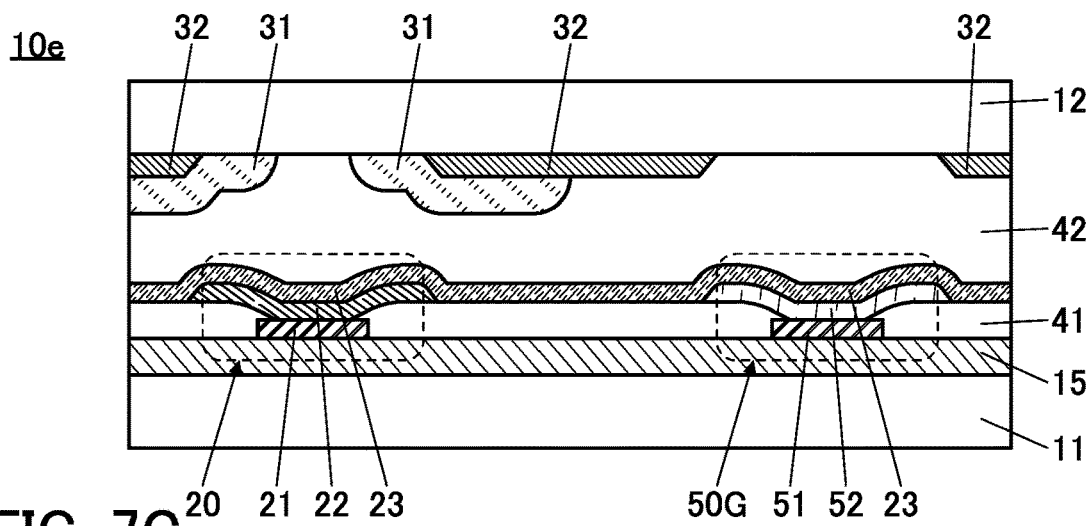

FIG. 7B illustrates a schematic cross-sectional view of a display device 10e provided with the light-blocking layer 32.

In the display device 10e, the light-blocking layer 32 is provided with opening portions that overlap with the light-emitting and light-receiving element 20 and the light-emitting element 50G, respectively. In addition, the light-blocking layer 32 is provided so as not to overlap with the light-emitting region of the light-emitting element 50G. Accordingly, even when the adhesive layer 42 has a large thickness, the viewing angle characteristics of the light-emitting element 50G can be improved.

Figure 7C:
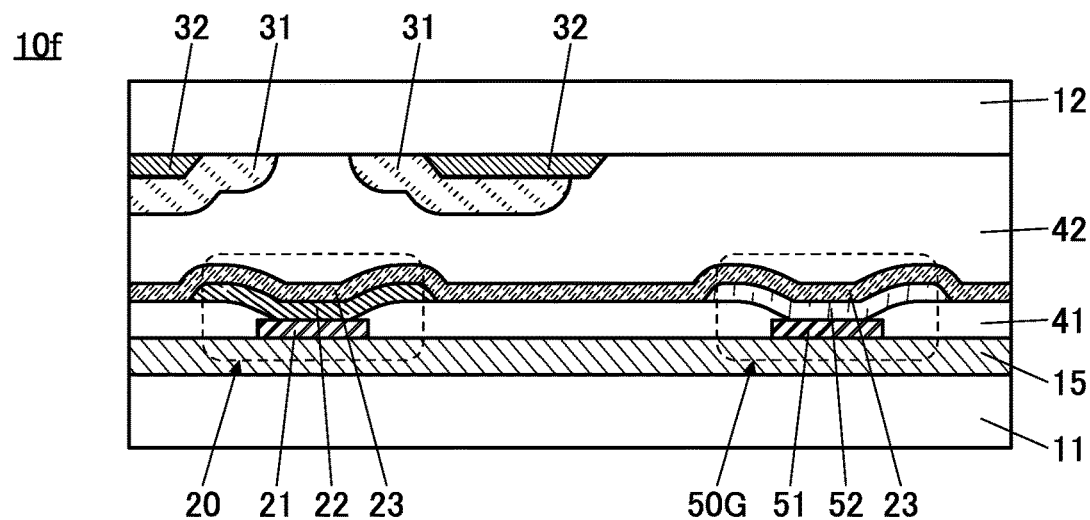

FIG. 7C illustrates a schematic cross-sectional view of a display device 10f that is different from the display device 10e in the structure of the light-blocking layer 32.

The display device 10f is an example in which the light-blocking layer 32 is not provided in the vicinity of the light-emitting element 50G. The light-blocking layer 32 is positioned between the light-emitting and light-receiving element 20 and the light-emitting element 50G in the plan view. Although not illustrated here, the light-blocking layer 32 can also be positioned between the light-emitting and light-receiving element 20 and the light-emitting element 50B in the plan view. Furthermore, the light-blocking layer 32 is not provided between the light-emitting element 50G and the light-emitting element 50B. With this, the viewing angle characteristics of the light-emitting element 50G (and the light-emitting element 50B) can be improved.

Although the color filter 31 is positioned only on the light-emitting and light-receiving element 20 side in the structure described above, a color filter may be positioned also on the light-emitting element 50G and the light-emitting element 50B sides. A material having a light-transmitting property with respect to light emitted by the light-emitting element can be used for the color filter positioned to overlap with the light-emitting element. Providing the color filter overlapping with the light-emitting element can increase the color purity of the light emitted by the light-emitting element, making it possible to achieve a display device with a high display quality.

Figure 8A:
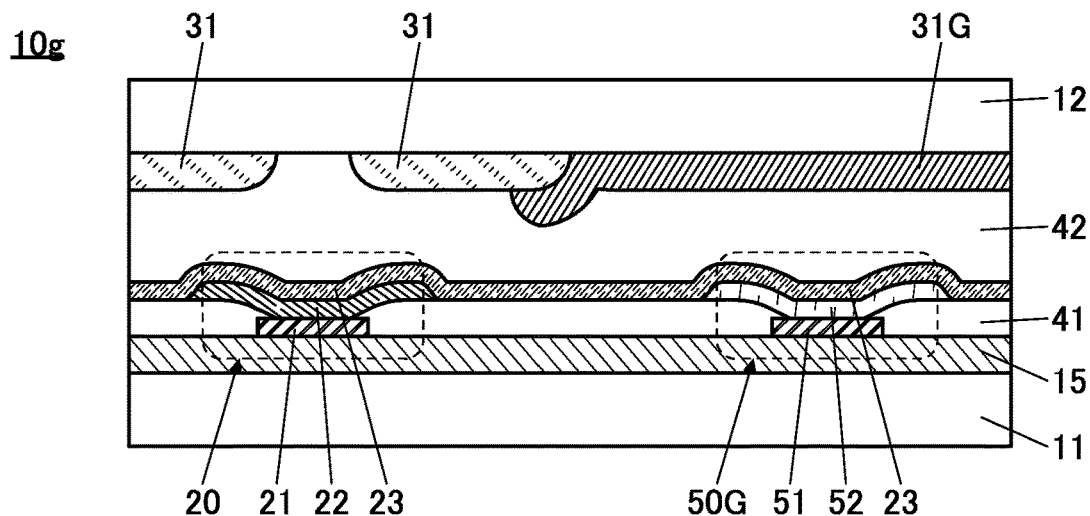
FIG. 8A to FIG. 8C are cross-sectional views illustrating examples of a display device.

FIG. 8A is a schematic cross-sectional view of a display device 10g. The display device 10g includes a color filter 31G.

Like the color filter 31, the color filter 31G is provided on the substrate 12 side. The color filter 31G includes a portion overlapping with the light-emitting element 50G in the plan view. Furthermore, the color filter 31G is preferably provided so as to include the light-emitting region of the light-emitting element 50G in the plan view.

The color filter 31G has a function of transmitting light of a color emitted by the light-emitting element 50G. For example, in the case where the light-emitting element 50G emits green light, the color filter 31G that transmits green light can be used. Similarly, a color filter transmitting light of a color emitted by the light-emitting element 50B (e.g., blue light) can be used for the light-emitting element 50B.

As illustrated in FIG. 8A, the display device 10g includes a region where the color filter 31G and the color filter 31 overlap with each other, between the light-emitting and light-receiving element 20 and the light-emitting element 50G in the plan view. In the region, light of a color emitted by the light-emitting and light-receiving element 20 is absorbed (blocked) by the color filter 31G, and light of a color emitted by the light-emitting element 50G is absorbed (blocked) by the color filter 31. Therefore, the region where the two color filters overlap with each other can function as a light-blocking layer.

Figure 8B:
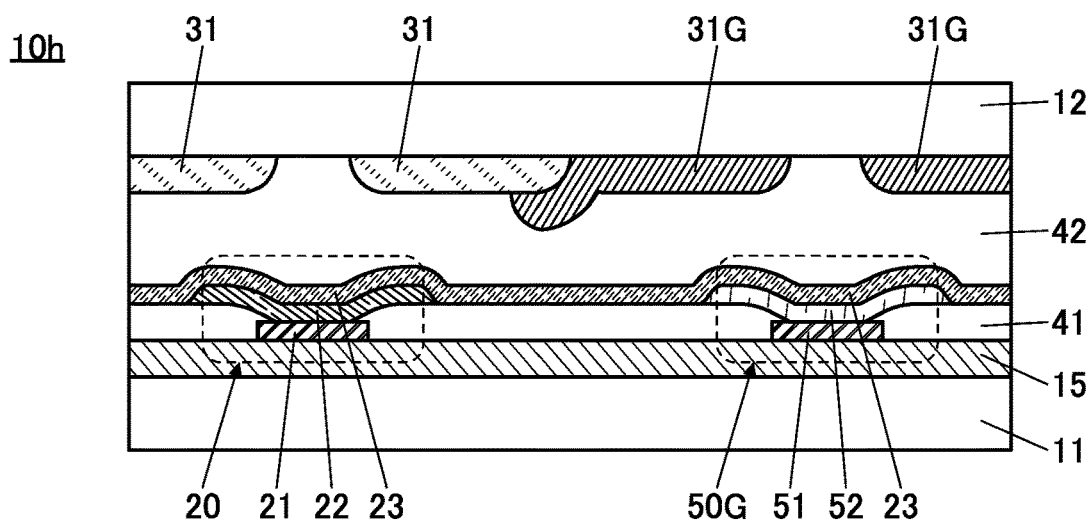

FIG. 8B is a schematic cross-sectional view of a display device 10h. The display device 10h is different from the display device 10g mainly in that the color filter 31G includes an opening portion.

The opening portion of the color filter 31G can be positioned so as to overlap with at least the light-emitting region of the light-emitting element 50G. The color filter 31G may be positioned so as to overlap with the light-emitting region of the light-emitting element 50G, and the light-emitting region of the light-emitting element 50G may be positioned on the inner side than the opening portion of the color filter 31G in the plan view. The positional relationship between the opening portion of the color filter 31G and the light-emitting element 50G can be the same as the positional relationship between the light-emitting and light-receiving region of the light-emitting and light-receiving element 20 and the opening portion of the color filter 31. Note that the same applies to the light-emitting element 50B.

Figure 8C:
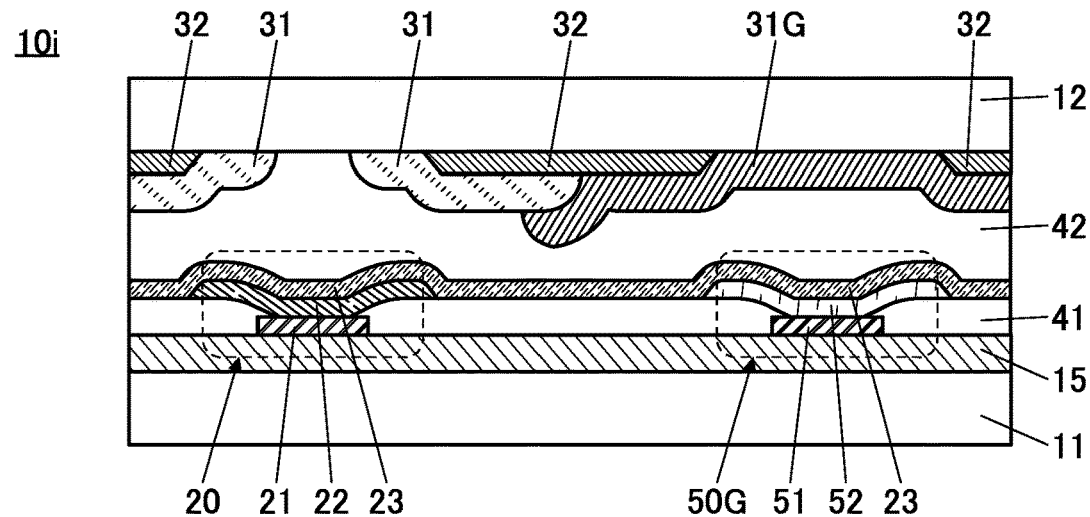

A structure provided with the light-blocking layer 32, like a display device 10i illustrated in FIG. 8C, may be employed. Although the color filter 31G does not include an opening portion in the example illustrated in FIG. 8C, the color filter 31G may include an opening portion, as in the display device 10h.

Structure Example 6

An example of a structure capable of capturing a higher resolution image is described below.

Figure 9A:
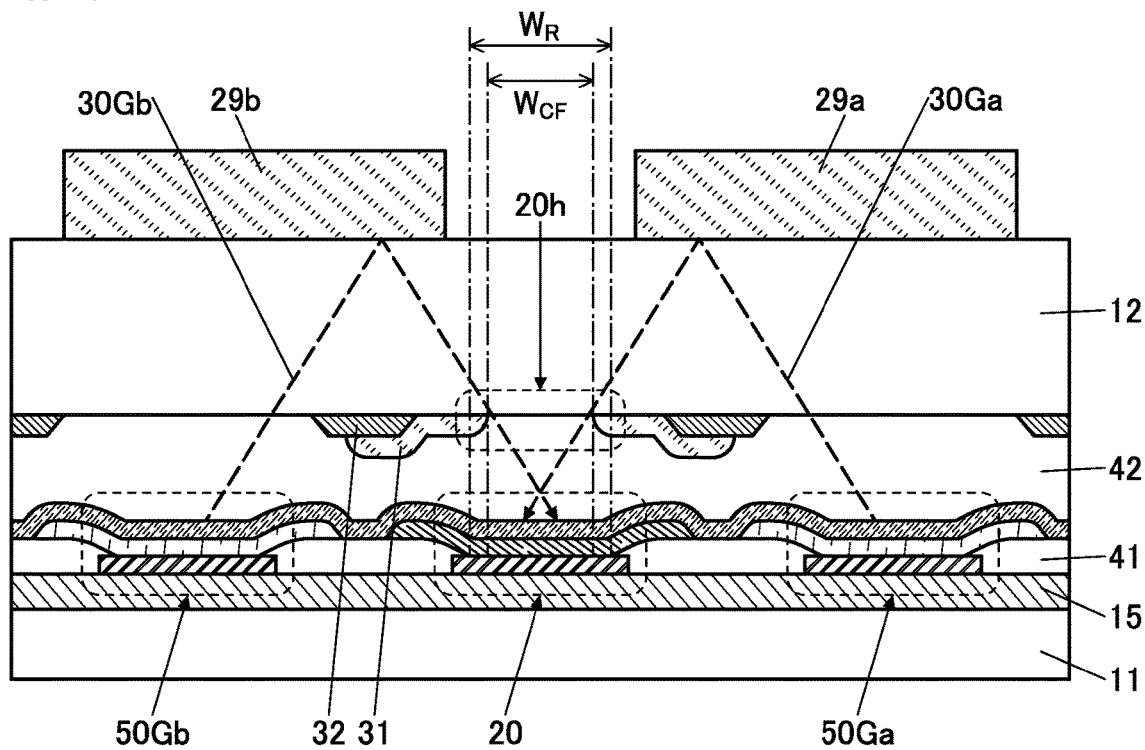
FIG. 9A and FIG. 9B are cross-sectional views illustrating examples of a display device.

FIG. 9A illustrates a schematic cross-sectional view of a display device. FIG. 9A illustrates a cross section including the light-emitting and light-receiving element 20, and a light-emitting element 50Ga and a light-emitting element 50Gb that are positioned on both sides of the light-emitting and light-receiving element 20.

In FIG. 9A, the opening portion 20h of the color filter 31 is positioned on the inner side than the width $W_R$ of the light-emitting and light-receiving region of the light-emitting and light-receiving element 20. Furthermore, the width $W_{CF}$ of the opening portion 20h of the color filter 31 is smaller than the width $W_R$.

In addition, a structure 29a and a structure 29b that are in contact with the surface of the substrate 12 are illustrated in FIG. 9A. The structure 29a and the structure 29b reflect and scatter light emitted by the light-emitting element 50Ga and the light-emitting element 50Gb. The structure 29a and the structure 29b are spaced at an interval that is almost the same as or less than the interval between the light-emitting and light-receiving element 20 and the light-emitting element 50Ga or the light-emitting element 50Gb.

As illustrated in FIG. 9A, part of light 30Ga emitted by the light-emitting element 50Ga is reflected or scattered by the structure 29a, and part of the reflected or scattered light passes through the opening portion 20h and reaches the light-emitting and light-receiving element 20. Similarly, part of light 30Gb emitted by the light-emitting element 50Gb is reflected or scattered by the structure 29b, and part of the reflected or scattered light passes through the opening portion 20h and reaches the light-emitting and light-receiving element 20. That is, both the light reflected (scattered) by the structure 29a and the light reflected (scattered) by the structure 29b are incident on the light-emitting and light-receiving element 20. Accordingly, as found from FIG. 9A, it is difficult to capture a clear image of a pattern having almost the same size as or smaller than the arrangement interval of the light-emitting and light-receiving element 20, the light-emitting element 50Ga, or the like.

Figure 9B:
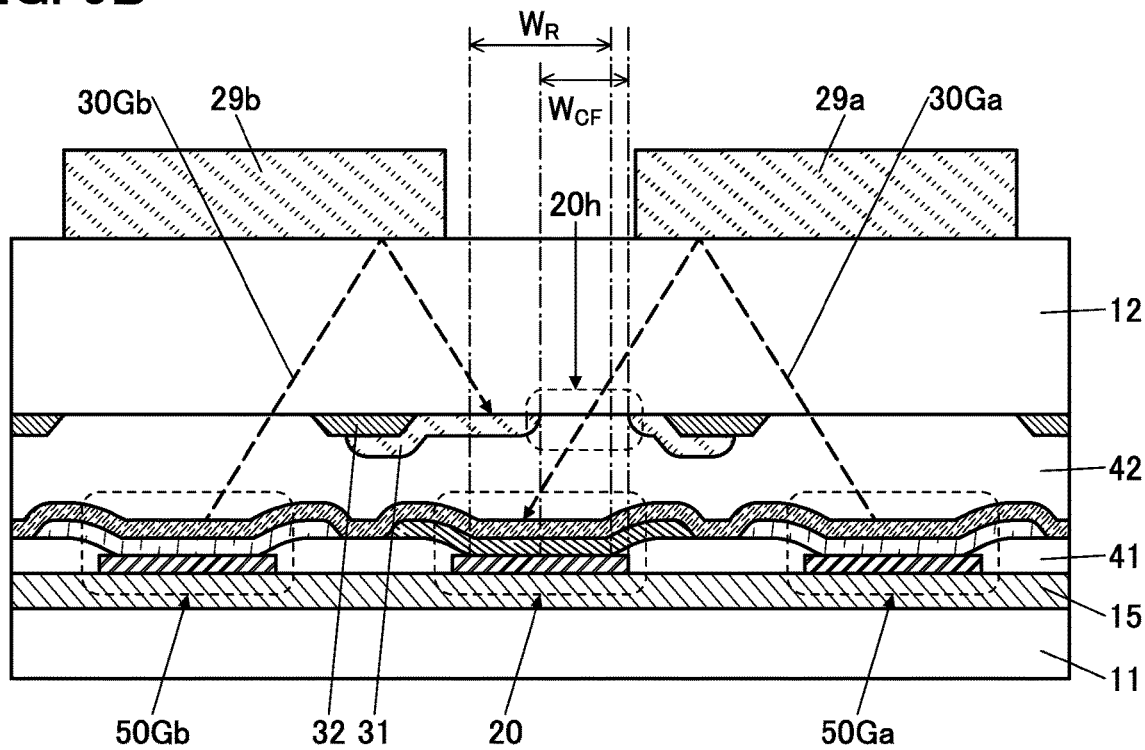

Therefore, the opening portion 20h of the color filter 31 is shifted to one light-emitting element (here, the light-emitting element 50Ga) side, as in a structure illustrated in FIG. 9B.

In FIG. 9B, the opening portion 20h of the color filter 31 is positioned on the outer side than the width $W_R$ of the light-emitting and light-receiving region of the light-emitting and light-receiving element 20. Note that the structure is not limited thereto as long as the center of the opening portion 20h of the color filter 31 is shifted from the center of the light-emitting and light-receiving region of the light-emitting and light-receiving element 20. Therefore, the opening portion 20h may be positioned in the inside of the light-emitting and light-receiving region of the light-emitting and light-receiving element 20, and the opening portion 20h does not necessarily overlap with the light-emitting and light-receiving region.

As illustrated in FIG. 9B, the opening portion 20h is shifted to the light-emitting element 50Ga side, whereby the light 30Gb emitted by the light-emitting element 50Gb and reflected or scattered by the structure 29b is absorbed by the color filter 31 and does not reach the light-emitting and light-receiving element 20. Meanwhile, part of the light 30Ga emitted by the light-emitting element 50Ga and reflected or scattered by the structure 29a passes through the opening portion 20h and reaches the light-emitting and light-receiving element 20. That is, only the light reflected (scattered) by the structure 29a is incident on the light-emitting and light-receiving element 20.

In this manner, the center position of the opening portion 20h of the color filter 31 is shifted, for example, from the center position of the light-emitting and light-receiving region of the light-emitting and light-receiving element 20 or the center position of the opening portion of the light-blocking layer 32, which makes it possible to increase the resolution of image capturing to capture a clear image. In particular, in the case where light reflected or scattered by a subject to be captured has a high proportion of specular reflection components to scattering components, a high effect is obtained for increasing the resolution of image capturing.

The above is the description of the structure example of the display device.

The display device of one embodiment of the present invention is a display device capable of achieving both display with high viewing angle characteristics and capturing of a clear image. In addition, the display device of one embodiment of the present invention can favorably capture an image of a fingerprint or a palm print; therefore, a function of biometric authentication such as fingerprint authentication or palm print authentication can be added to an electronic device including the display device without an additional component, whereby the electronic device can be multifunctional.

At least part of the configuration examples, the drawings corresponding thereto, and the like shown in this embodiment as an example can be implemented in combination with the other configuration examples, the other drawings, and the like as appropriate.

At least part of this embodiment can be implemented in combination with the other embodiments described in this specification as appropriate.

Embodiment 2

In this embodiment, structure examples of a display device of one embodiment of the present invention, which includes a light-emitting element and a light-emitting and light-receiving element, are described.

The display device of one embodiment of the present invention includes a light-emitting element and a light-emitting and light-receiving element.

The light-emitting and light-receiving element has both a function of an organic EL element serving as a light-emitting element and a function of an organic photodiode serving as a light-receiving element. For example, by adding an active layer that can be used for an organic photodiode to a stacked-layer structure of an organic EL element, the light-emitting and light-receiving element can be manufactured. Furthermore, when layers common to the light-emitting and light-receiving element and the light-emitting element are deposited in the same steps at the time of manufacturing the light-emitting and light-receiving element and the light-emitting element, an increase in the number of deposition steps can be inhibited.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer is preferably a layer shared by the light-emitting and light-receiving element and the light-emitting element. As another example, the light-emitting and light-receiving element and the light-emitting element can have the same structure except for the presence or absence of an active layer. That is, the light-emitting and light-receiving element can be manufactured by only adding the active layer to the light-emitting element. When the light-emitting and light-receiving element and the light-emitting element include common layers in such a manner, the number of deposition steps and the number of masks can be reduced, thereby reducing the number of manufacturing steps and the manufacturing cost of the display device. Furthermore, the display device including the light-emitting and light-receiving element can be manufactured using an existing manufacturing apparatus and an existing manufacturing method for the display device.

Note that a layer included in the light-emitting and light-receiving element may have a different function between the case where the light-emitting and light-receiving element function as a light-receiving element and the case where the light-emitting and light-receiving element function as a light-emitting element. In this specification, the name of a component is based on its function in the case where the light-emitting and light-receiving element functions as a light-emitting element. For example, a hole-injection layer functions as a hole-injection layer in the case where the light-emitting and light-receiving element functions as a light-emitting element, and functions as a hole-transport layer in the case where the light-emitting and light-receiving element functions as a light-receiving element. Similarly, an electron-injection layer functions as an electron-injection layer in the case where the light-emitting and light-receiving element functions as a light-emitting element, and functions as an electron-transport layer in the case where the light-emitting and light-receiving element function as a light-receiving element.

As described above, the display device of this embodiment includes light-emitting and light-receiving elements and light-emitting elements in its display portion. Specifically, light-emitting and light-receiving elements and light-emitting elements are arranged in a matrix in the display portion. Accordingly, the display portion has one or both of an image capturing function and a sensing function in addition to a function of displaying an image.

The display portion can be used as an image sensor, a touch sensor, or the like. That is, by sensing light with the display portion, an image can be captured or an object (e.g., a finger or a stylus) that is in contact with or approaches the display portion can be detected, for example. Furthermore, in the display device of this embodiment, the light-emitting elements can be used as a light source of the sensor. Accordingly, a light-receiving portion and a light source do not need to be provided separately from the display device; hence, the number of components of an electronic device can be reduced.

In the display device of this embodiment, when an object reflects light emitted from the light-emitting element included in the display portion, the light-emitting and light-receiving element can sense the reflected light; thus, image capturing or touch (contact or approach) detection is possible even in a dark place.

The display device of this embodiment has a function of displaying images with the use of the light-emitting elements and the light-emitting and light-receiving elements. That is, the light-emitting elements and the light-emitting and light-receiving elements function as display elements.

As the light-emitting element, an EL element such as an OLED (Organic Light Emitting Diode) or a QLED (Quantum-dot Light Emitting Diode) is preferably used. Examples of a light-emitting substance contained in the EL element include a substance exhibiting fluorescence (a fluorescent material), a substance exhibiting phosphorescence (a phosphorescent material), a substance exhibiting thermally activated delayed fluorescence (a thermally activated delayed fluorescence (TADF) material), and an inorganic compound (such as a quantum dot material). Alternatively, an LED such as a micro-LED (Light Emitting Diode) can be used as the light-emitting element.

The display device of this embodiment has a function of detecting light with the use of the light-emitting and light-receiving elements. The light-emitting and light-receiving element can sense light having a shorter wavelength than light emitted by the light-emitting and light-receiving element itself.

When the light-emitting and light-receiving element is used as an image sensor, the display device of this embodiment can capture an image using the light-emitting and light-receiving element. For example, the display device of this embodiment can be used as a scanner.

For example, data on a fingerprint, a palm print, or the like can be obtained owing to the function of the image sensor. That is, a biological authentication sensor can be incorporated in the display device of this embodiment. When the display device incorporates a biological authentication sensor, the number of components of an electronic device can be reduced as compared to the case where a biological authentication sensor is provided separately from the display device; thus, the size and weight of the electronic device can be reduced.

Data on facial expression, eye movement, change of the pupil diameter, or the like of a user can be obtained owing to the function of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-emitting and light-receiving element is used as a touch sensor, the display device of this embodiment can detect the approach or contact of an object with the use of the light-emitting and light-receiving element.

The light-emitting and light-receiving element functions as a photoelectric conversion element that detects light entering the light-emitting and light-receiving element and generates electric charge. The amount of generated electric charge depends on the amount of light incident on the light-emitting and light-receiving element.

The light-emitting and light-receiving element can be manufactured by adding an active layer of the light-receiving element to the above-described structure of the light-emitting element. For the light-emitting and light-receiving element, an active layer of a pn photodiode or a pin photodiode can be used, for example. It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of display devices.

FIG. 10A to FIG. 10D are cross-sectional views of display devices of embodiments of the present invention.

Figure 10A:
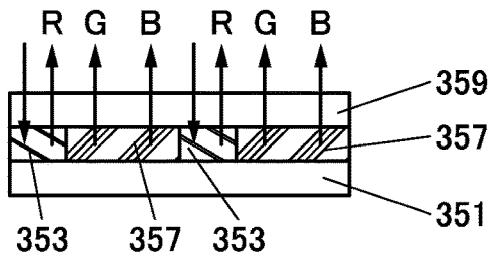
FIG. 10A to FIG. 10D are cross-sectional views illustrating examples of a display device.

A display device 350A illustrated in FIG. 10A includes, between a substrate 351 and a substrate 359, a layer 353 including a light-emitting and light-receiving element and a layer 357 including light-emitting elements.

Figure 10B:
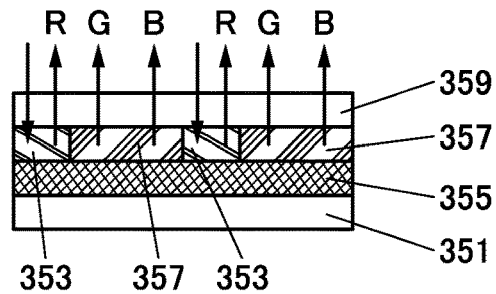

A display device 350B illustrated in FIG. 10B includes, between the substrate 351 and the substrate 359, the layer 353 including a light-emitting and light-receiving element, a layer 355 including transistors, and the layer 357 including light-emitting elements.

In the display device 350A and the display device 350B, green (G) light and blue (B) light are emitted from the layer 357 including light-emitting elements, and red (R) light is emitted from the layer 353 including a light-emitting and light-receiving element. In the display device of one embodiment of the present invention, the color of light emitted from the layer 353 including a light-emitting and light-receiving element is not limited to red.

The light-emitting and light-receiving element included in the layer 353 including the light-emitting and light-receiving element can detect light that enters from the outside of the display device 350A or the display device 350B. The light-emitting and light-receiving element can detect one or both of green (G) light and blue (B) light, for example.

The display device of one embodiment of the present invention includes a plurality of pixels arranged in a matrix. One pixel includes one or more subpixels. One subpixel includes one light-emitting and light-receiving element or one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The subpixel of at least one color includes a light-emitting and light-receiving element. The light-emitting and light-receiving element may be provided in all the pixels or may be provided in some of the pixels. In addition, one pixel may include a plurality of light-emitting and light-receiving elements.

The layer 355 including transistors includes a transistor electrically connected to the light-emitting and light-receiving element and a transistor electrically connected to the light-emitting element, for example. The layer 355 including transistors may also include a wiring, an electrode, a terminal, a capacitor, a resistor, or the like.

Figure 10C:
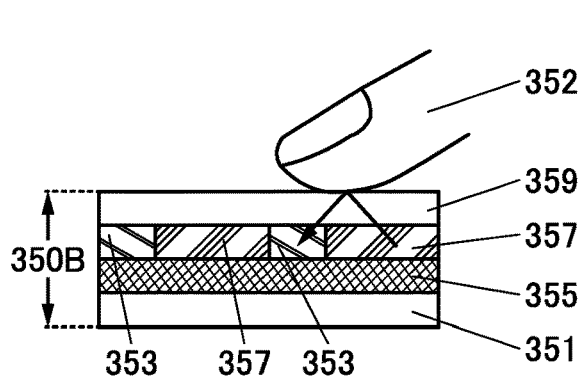
Figure 10D:
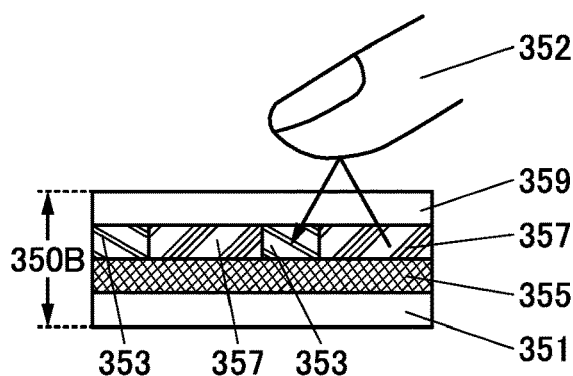

The display device of one embodiment of the present invention may have a function of detecting an object such as a finger that is touching the display device (FIG. 10C). Alternatively, the display device of one embodiment of the present invention may have a function of detecting an object that is approaching (but is not touching) the display device (FIG. 10D). For example, light emitted from the light-emitting element in the layer 357 including light-emitting elements is reflected by a finger 352 that touches or approaches the display device 350B as illustrated in FIG. 10C and FIG. 10D; then, the light-emitting and light-receiving element in the layer 353 including the light-emitting and light-receiving element senses the reflected light. Thus, the touch or approach of the finger 352 on/to the display device 350B can be detected.

[Pixel]

FIG. 10E to FIG. 10G and FIG. 11A to FIG. 11D illustrate examples of pixels. Note that the arrangement of subpixels is not limited to the illustrated order. For example, the positions of a subpixel (B) and a subpixel (G) may be reversed.

Figure 10E:
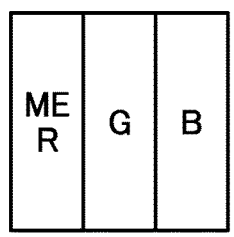
FIG. 10E to FIG. 10G are top views illustrating examples of a pixel.

A pixel illustrated in FIG. 10E employs stripe arrangement and includes a subpixel (MER) that emits red light and has a light-receiving function, a subpixel (G) that emits green light, and a subpixel (B) that emits blue light. By using a light-emitting and light-receiving element instated of a light-emitting element in the R subpixel, a display device including a pixel composed of three subpixels of RGB can have a light-receiving function in the pixel.

Figure 10F:
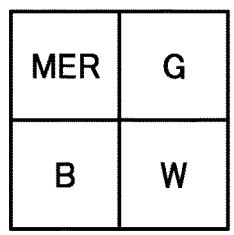

A pixel illustrated in FIG. 10F employs matrix arrangement and includes the subpixel (MER) that emits red light and has a light-receiving function, the subpixel (G) that emits green light, the subpixel (B) that emits blue light, and a subpixel (W) that emits white light. By using a light-emitting and light-receiving element instead of a light-emitting element in the R subpixel, a display device including a pixel composed of four subpixels of RGBW can also have a light-receiving function in the pixel.

Figure 10G:
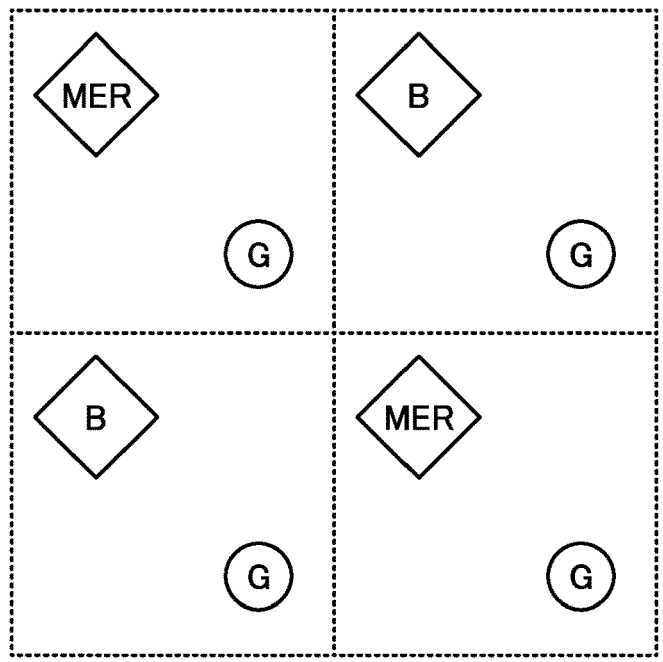

Pixels illustrated in FIG. 10G employ PenTile arrangement and each include subpixels emitting light of two colors that differ among the pixels. The upper left pixel and the lower right pixel in FIG. 10G each include the subpixel (MER) that emits red light and has a light-receiving function and the subpixel (G) that emits green light. The lower left pixel and the upper right pixel in FIG. 10G each include the subpixel (G) that emits green light and the subpixel (B) that emits blue light. Note that the shape of the subpixels illustrated in FIG. 10G indicates a top surface shape of the light-emitting element or the light-emitting and light-receiving element included in the subpixels.

Figure 11A:
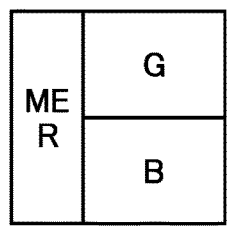
FIG. 11A to FIG. 11D are top views illustrating examples of a pixel.

A pixel illustrated in FIG. 11A includes the subpixel (MER) that emits red light and has a light-receiving function, the subpixel (G) that emits green light, and the subpixel (B) that emits blue light. The subpixel (MER) is provided in a column different from a column where the subpixel (G) and the subpixel (B) are positioned. The subpixel (G) and the subpixel (B) are alternately arranged in the same column; one is provided in an odd-numbered row and the other is provided in an even-numbered row. Note that the color of the subpixel positioned in a column different from the column where the subpixels of the other colors are positioned is not limited to red (R) and may alternatively be green (G) or blue (B).

Figure 11B:
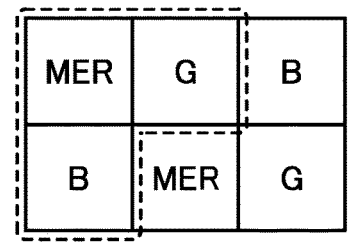

FIG. 11B illustrates two pixels, and one pixel is composed of three subpixels surrounded by dotted lines. The pixel illustrated in FIG. 11B includes the subpixel (MER) that emits red light and has a light-receiving function, the subpixel (G) that emits green light, and the subpixel (B) that emits blue light. In the pixel on the left in FIG. 11B, the subpixel (G) is positioned in the same row as the subpixel (MER), and the subpixel (B) is positioned in the same column as the subpixel (MER). In the pixel on the right in FIG. 11B, the subpixel (G) is positioned in the same row as the subpixel (MER), and the subpixel (B) is positioned in the same column as the subpixel (G). In the pixel layout illustrated in FIG. 11B, the subpixel (MER), the subpixel (G), and the subpixel (B) are repeatedly arranged in both the odd-numbered row and the even-numbered row. In addition, subpixels of different colors are arranged in the odd-numbered row and the even-numbered row in every column.

Figure 11C:
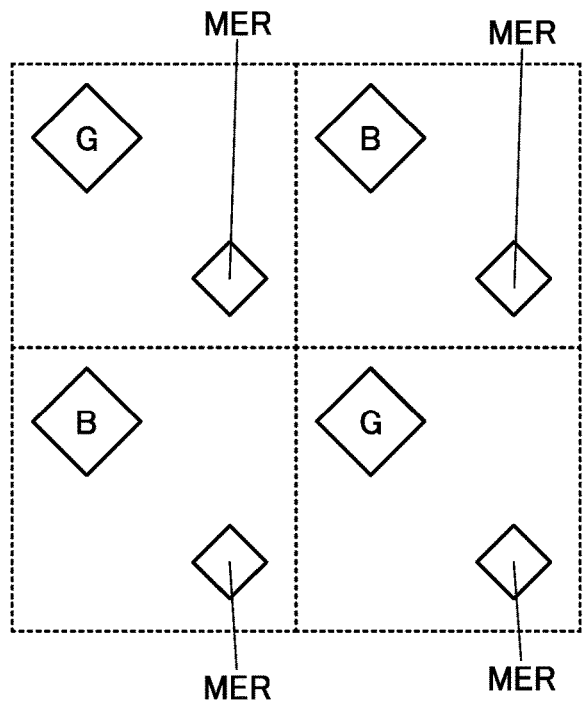

FIG. 11C shows a variation example of the pixel arrangement of FIG. 10G. The upper left pixel and the lower right pixel in FIG. 11C each include the subpixel (MER) that emits red light and has a light-receiving function and the subpixel (G) that emits green light. The lower left pixel and the upper right pixel in FIG. 11C each include the subpixel (MER) that emits red light and has a light-receiving function and the subpixel (B) that emits blue light.

In FIG. 10G, the subpixel (G) that emits green light is provided in each pixel. Meanwhile, in FIG. 11C, the subpixel (MER) that emits red light and has a light-receiving function is provided in each pixel. The structure illustrated in FIG. 11C achieves higher-resolution image capturing than the structure illustrated in FIG. 10G because the subpixel having a light-receiving function is provided in each pixel. Thus, the accuracy of biometric authentication can be increased, for example.

The top surface shape of the light-emitting elements and the light-emitting and light-receiving elements is not particularly limited and can be a circular shape, an elliptical shape, a polygonal shape, a polygonal shape with rounded corners, or the like. The top surface shape of the light-emitting elements included in the subpixels (G) is circular in the example in FIG. 10G and square in the example in FIG. 11C. The top surface shape of the light-emitting elements and the light-emitting and light-receiving elements may vary depending on the color thereof, or the light-emitting elements and the light-emitting and light-receiving elements of some colors or every color may have the same top surface shape.

The aperture ratio of subpixels may vary depending on the color thereof, or may be the same among the subpixels of some colors or all colors. For example, the aperture ratio of a subpixel provided in each pixel (the subpixel (G) in FIG. 10G, and the subpixel (MER) in FIG. 11C) may be made lower than that of a subpixel of another color.

Figure 11D:
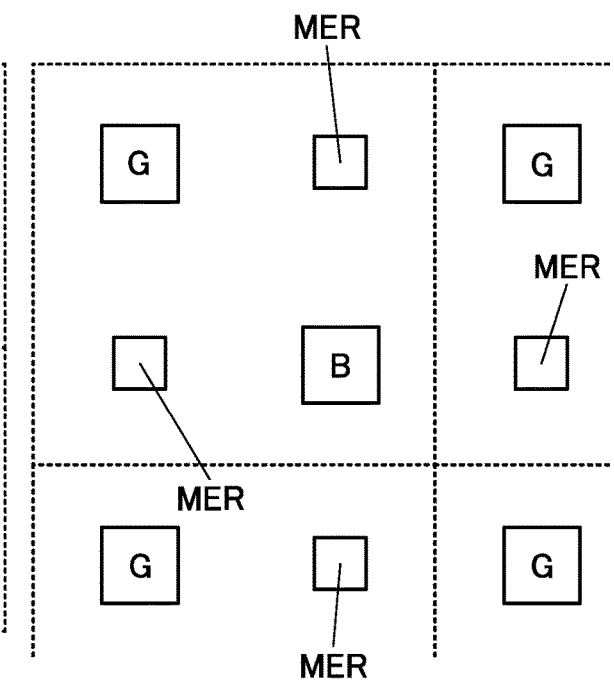

FIG. 11D shows a variation example of the pixel arrangement of FIG. 11C. Specifically, the structure of FIG. 11D is obtained by rotating the structure of FIG. 11C by 45°. Although one pixel is regarded as being composed of two subpixels in FIG. 11C, one pixel can be regarded as being composed of four subpixels as illustrated in FIG. 11D.

In the description with reference to FIG. 11D, one pixel is regarded as being composed of four subpixels surrounded by dotted lines. One pixel includes two subpixels (MER), one subpixel (G), and one subpixel (B). The pixel including a plurality of subpixels having a light-receiving function allows high-resolution image capturing. Accordingly, the accuracy of biometric authentication can be increased. For example, the resolution of image capturing can be the square root of 2 times the resolution of display.

A display device that employs the structure illustrated in FIG. 11C or FIG. 11D includes p first light-emitting elements (p is an integer greater than or equal to 2), q second light-emitting elements (q is an integer greater than or equal to 2), and r light-emitting and light-receiving elements (r is an integer greater than p and greater than q). As for p and r, r=2p is satisfied. As for p, q, and r, r=p+q is satisfied. Either the first light-emitting elements or the second light-emitting elements emits green light, and the other light-emitting elements emit blue light. The light-emitting and light-receiving elements emit red light and have a light-receiving function.

In the case where touch detection is performed with the light-emitting and light-receiving elements, for example, it is preferable that light emitted from a light source be hard for a user to recognize. Since blue light has low visibility than green light, light-emitting elements that emit blue light are preferably used as a light source. Accordingly, the light-emitting and light-receiving elements preferably have a function of receiving blue light.

As described above, the display device of one embodiment of the present invention can employ pixels with a variety of arrangements.

The pixel arrangement in the display device of this embodiment need not be changed when a light-receiving function is incorporated into pixels; thus, the display portion can be provided with one or both of an image capturing function and a sensing function without a reduction in the aperture ratio or resolution.

[Light-Emitting and Light-Receiving Element]

FIG. 12A to FIG. 12E illustrate examples of layered structures of light-emitting and light-receiving elements.

The light-emitting and light-receiving element includes at least an active layer and a light-emitting layer between a pair of electrodes.

In addition to the active layer and the light-emitting layer, the light-emitting and light-receiving element may further include a layer containing a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with high electron- and hole-transport properties), or the like.

The light-emitting and light-receiving elements illustrated in FIG. 12A to FIG. 12C each include a first electrode 180, a hole-injection layer 181, a hole-transport layer 182, an active layer 183, a light-emitting layer 193, an electron-transport layer 184, an electron-injection layer 185, and a second electrode 189.

The first electrode 180 functions as an anode of the light-emitting and light-receiving element. The second electrode 189 functions as a cathode of the light-emitting and light-receiving element.

Note that each of the light-emitting and light-receiving elements illustrated in FIG. 12A to FIG. 12C can be regarded as having a structure where the active layer 183 is added to a light-emitting element. Therefore, the light-emitting and light-receiving element can be formed concurrently with the light-emitting element only by adding a step of forming the active layer 183 in the manufacturing process of the light-emitting element. The light-emitting element and the light-emitting and light-receiving element can be formed over one substrate. Thus, the display portion can be provided with one or both of an image capturing function and a sensing function without a significant increase in the number of manufacturing steps.

The stacking order of the light-emitting layer 193 and the active layer 183 is not limited. FIG. 12A illustrates an example in which the active layer 183 is provided over the hole-transport layer 182 and the light-emitting layer 193 is provided over the active layer 183. FIG. 12B illustrates an example in which the light-emitting layer 193 is provided over the hole-transport layer 182 and the active layer 183 is provided over the light-emitting layer 193. The active layer 183 and the light-emitting layer 193 may be in contact with each other as illustrated in FIG. 12A and FIG. 12B.

As illustrated in FIG. 12C, a buffer layer is preferably provided between the active layer 183 and the light-emitting layer 193. As the buffer layer, at least one layer of a hole-injection layer, a hole-transport layer, an electron-transport layer, an electron-injection layer, a hole-blocking layer, an electron-blocking layer, and the like can be used. FIG. 12C illustrates an example in which the hole-transport layer 182 is used as the buffer layer.

The buffer layer provided between the active layer 183 and the light-emitting layer 193 can inhibit transfer of excitation energy from the light-emitting layer 193 to the active layer 183. Furthermore, the buffer layer can also be used to adjust the optical path length (cavity length) of the microcavity structure. Thus, high emission efficiency can be obtained from the light-emitting and light-receiving element including the buffer layer between the active layer 183 and the light-emitting layer 193.

The light-emitting and light-receiving element illustrated in FIG. 12D is different from the light-emitting and light-receiving elements illustrated in FIG. 12A to FIG. 12C in not including the hole-transport layer 182. The light-emitting and light-receiving element may exclude at least one of the hole-injection layer 181, the hole-transport layer 182, the electron-transport layer 184, and the electron-injection layer 185. Furthermore, the light-emitting and light-receiving element may include another functional layer such as a hole-blocking layer or an electron-blocking layer.

The light-emitting and light-receiving element illustrated in FIG. 12E is different from the light-emitting and light-receiving elements illustrated in FIG. 12A to FIG. 12D in including a layer 186 serving as both a light-emitting layer and an active layer instead of including the active layer 183 and the light-emitting layer 193.

As the layer 186 serving as both a light-emitting layer and an active layer, it is possible to use, for example, a layer containing three materials which are an n-type semiconductor that can be used for the active layer 183, a p-type semiconductor that can be used for the active layer 183, and a light-emitting substance that can be used for the light-emitting layer 193.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap each other and are further preferably positioned fully apart from each other.

In the light-emitting and light-receiving element, a conductive film that transmits visible light is used as the electrode through which light is extracted. A conductive film that reflects visible light is preferably used as the electrode through which light is not extracted.

When the light-emitting and light-receiving element is driven as a light-emitting element, the hole-injection layer serves as a layer that injects holes from the anode to the light-emitting and light-receiving element. The hole-injection layer is a layer containing a material with a high hole-injection property. As the material with a high hole-injection property, it is possible to use, for example, a composite material containing a hole-transport material and an acceptor material (electron-accepting material) or an aromatic amine compound.

When the light-emitting and light-receiving element is driven as a light-emitting element, the hole-transport layer serves as a layer that transports holes injected from the anode by the hole-injection layer, to the light-emitting layer. When the light-emitting and light-receiving element is driven as a light-receiving element, the hole-transport layer serves as a layer that transports holes generated in the active layer on the basis of incident light, to the anode. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, a material having a high hole-transport property, such as a n-electron-rich heteroaromatic compound (e.g., a carbazole derivative, a thiophene derivative, and a furan derivative) or an aromatic amine (a compound having an aromatic amine skeleton), is preferable.

When the light-emitting and light-receiving element is driven as a light-emitting element, the electron-transport layer serves as a layer that transports electrons injected from the cathode by the electron-injection layer, to the light-emitting layer. When the light-emitting and light-receiving element is driven as a light-receiving element, the electron-transport layer serves as a layer that transports electrons generated in the active layer on the basis of incident light, to the cathode. The electron-transport layer is a layer containing an electron-transport material. As the electron-transport material, a substance with an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a T-electron deficient heteroaromatic compound such as a nitrogen-containing heteroaromatic compound.

When the light-emitting and light-receiving element is driven as a light-emitting element, the electron-injection layer serves as a layer that injects electrons from the cathode to the light-emitting and light-receiving element. The electron-injection layer is a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 193 is a layer that contains a light-emitting substance. The light-emitting layer 193 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 193 may contain one or more kinds of organic compounds (e.g., a host material and an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer 193 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 183 contains a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 and the active layer 183 can be formed by the same method (e.g., a vacuum evaporation method) and thus the same manufacturing apparatus can be used.

Examples of an n-type semiconductor material contained in the active layer 183 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. However, since fullerene has a spherical shape, fullerene has a high electron-accepting property even when π-electrons widely spread. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of the p-type semiconductor material contained in the active layer 183 include electron-donating organic semiconductor materials such as copper (II) phthalocyanine (CuPc), tetraphenyldibenzoperiflanthene (DBP), zinc phthalocyanine (ZnPc), tin phthalocyanine (SnPc), and quinacridone.

Examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a tetracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer 183 is preferably formed by co-evaporation of an n-type semiconductor and a p-type semiconductor.

The layer 186 serving as both a light-emitting layer and an active layer is preferably formed using the above-described light-emitting material, n-type semiconductor, and p-type semiconductor.

The hole-injection layer 181, the hole-transport layer 182, the active layer 183, the light-emitting layer 193, the electron-transport layer 184, the electron-injection layer 185, and the layer 186 serving as both a light-emitting layer and an active layer may be formed using either a low-molecular compound or a high-molecular compound and may contain an inorganic compound. Each of the layers can be formed by an evaporation method (including a vacuum evaporation method), a transfer method, a printing method, an inkjet method, a coating method, or the like.

Each of the layers included in the light-emitting and light-receiving element or the light-emitting element can have a single-layer structure including a single material (compound), a single-layer structure including a plurality of materials, a stacked-layer structure in which two or more layers including a single material are stacked, a stacked-layer structure in which two or more layers including a plurality of materials are stacked, or a stacked-layer structure in which one or more layers including a single material and one or more layers including a plurality of materials are stacked. In the case where the layer including the plurality of materials is formed by a vacuum evaporation method, either a co-evaporation in which two or more materials are evaporated or sublimated to perform deposition or a premix method in which two or more materials are mixed in advance and the mixed material is evaporated or sublimated to perform deposition can be used. Alternatively, a layer including three or more materials may be deposited by a combination of a co-evaporation method and a premix method.

Detailed structures of the light-emitting and light-receiving element and the light-emitting elements included in the display device of one embodiment of the present invention will be described below with reference to FIG. 13A to FIG. 15B.

The display device of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

FIG. 13A to FIG. 15B illustrate top-emission display devices as examples.

Structure Example 1

Figure 13A:
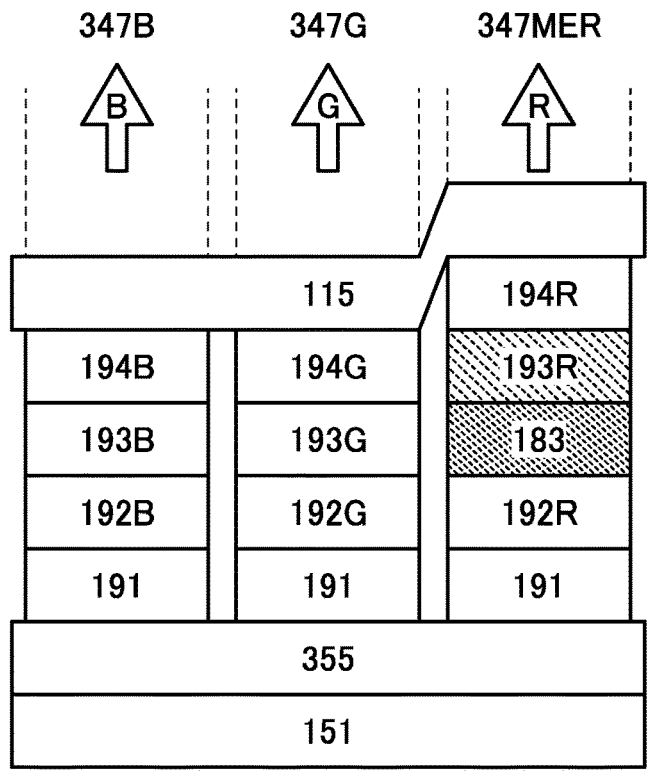
FIG. 13A and FIG. 13B are cross-sectional views illustrating examples of a display device.
Figure 13B:
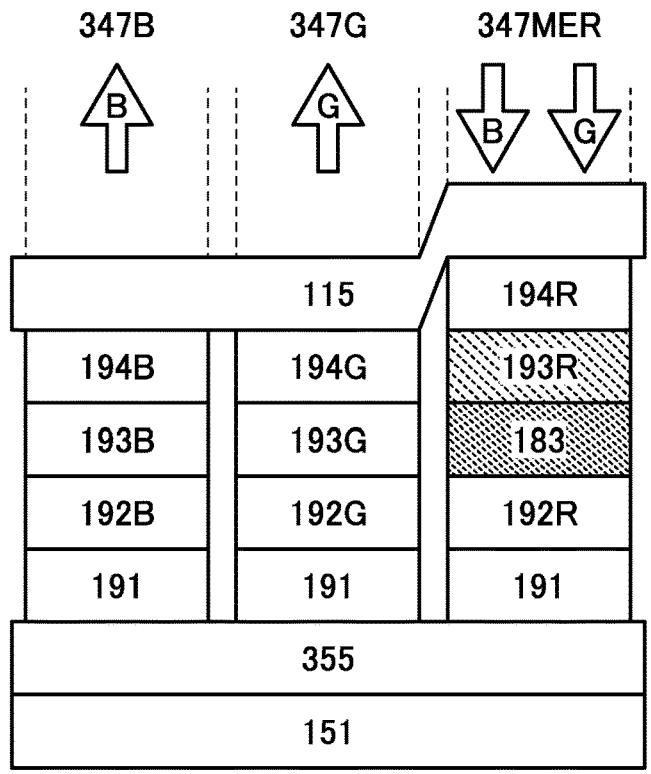

The display device illustrated in FIG. 13A and FIG. 13B includes a light-emitting element 347B that emits blue (B) light, a light-emitting element 347G that emits green (G) light, and a light-emitting and light-receiving element 347MER that emits red (R) light and has a light-receiving function over a substrate 151 with the layer 355 including transistors therebetween.

FIG. 13A shows the case where the light-emitting and light-receiving element 347MER functions as a light-emitting element. FIG. 13A illustrates an example in which the light-emitting element 347B emits blue light, the light-emitting element 347G emits green light, and the light-emitting and light-receiving element 347MER emits red light.

FIG. 13B shows the case where the light-emitting and light-receiving element 347MER functions as a light-receiving element. FIG. 13B illustrates an example in which the light-emitting and light-receiving element 347MER detects blue light emitted by the light-emitting element 347B and green light emitted by the light-emitting element 347G.

The light-emitting element 347B, the light-emitting element 347G, and the light-emitting and light-receiving element 347MER each include a pixel electrode 191 and a common electrode 115. In this embodiment, the case where the pixel electrode 191 functions as an anode and the common electrode 115 functions as a cathode is described as an example.

In the description in this embodiment, also in the light-emitting and light-receiving element 347MER, the pixel electrode 191 functions as an anode and the common electrode 115 functions as a cathode as in the light-emitting elements. In other words, when the light-emitting and light-receiving element 347MER is driven by application of reverse bias between the pixel electrode 191 and the common electrode 115, light entering the light-emitting and light-receiving element 347MER can be detected and electric charge can be generated and extracted as current.

The common electrode 115 is shared by the light-emitting element 347B, the light-emitting element 347G, and the light-emitting and light-receiving element 347MER.

The material, thickness, and the like of the pair of electrodes can be the same in the light-emitting element 347B, the light-emitting element 347G, and the light-emitting and light-receiving element 347MER. Accordingly, the manufacturing cost of the display device can be reduced, and the manufacturing process of the display device can be simplified.

The structure of the display device illustrated in FIG. 13A and FIG. 13B will be specifically described.

The light-emitting element 347B includes a buffer layer 192B, a light-emitting layer 193B, and a buffer layer 194B in this order over the pixel electrode 191. The light-emitting layer 193B contains a light-emitting substance that emits blue light. The light-emitting element 347B has a function of emitting blue light.

The light-emitting element 347G includes a buffer layer 192G, a light-emitting layer 193G, and a buffer layer 194G in this order over the pixel electrode 191. The light-emitting layer 193G contains a light-emitting substance that emits green light. The light-emitting element 347G has a function of emitting green light.

The light-emitting and light-receiving element 347MER includes a buffer layer 192R, the active layer 183, a light-emitting layer 193R, and a buffer layer 194R in this order over the pixel electrode 191. The light-emitting layer 193R contains a light-emitting substance that emits red light. The active layer 183 contains an organic compound that absorbs light having a shorter wavelength than red light (e.g., one or both of green light and blue light). Note that an organic compound that absorbs ultraviolet light as well as visible light may be used for the active layer 183. The light-emitting and light-receiving element 347MER has a function of emitting red light. The light-emitting and light-receiving element 347MER has a function of detecting light emitted from at least one of the light-emitting element 347G and the light-emitting element 347B and preferably has a function of detecting light emitted from both of them.

The active layer 183 preferably contains an organic compound that does not easily absorb red light and that absorbs light having a shorter wavelength than red light. Thus, the light-emitting and light-receiving device 347MRE can have a function of efficiently emitting red light and a function of accurately detecting light having a shorter wavelength than red light. It is preferable to select the material of the active layer 183 so that the absorption spectrum of the organic compound included in the active layer 183 cannot overlap with the emission spectrum of the light-emitting material included in the light-emitting layer 193R.

The pixel electrode 191, the buffer layer 192R, the buffer layer 192G, the buffer layer 192B, the active layer 183, the light-emitting layer 193R, the light-emitting layer 193G, the light-emitting layer 193B, the buffer layer 194R, the buffer layer 194G, the buffer layer 194B, and the common electrode 115 may each have a single-layer structure or a stacked-layer structure.

In the display device illustrated in FIG. 13A and FIG. 13B, the buffer layer, the active layer, and the light-emitting layer are formed in each element individually.

The buffer layer 192R, the buffer layer 192G, and the buffer layer 192B can each include one or both of a hole-injection layer and a hole-transport layer. Furthermore, the buffer layer 192R, the buffer layer 192G, and the buffer layer 192B may each include an electron-blocking layer. The buffer layer 194B, the buffer layer 194G, and the buffer layer 194R can each include one or both of an electron-injection layer and an electron-transport layer. Furthermore, the buffer layer 194R, the buffer layer 194G, and the buffer layer 194B may each include a hole-blocking layer. Note that the above description of the layers included in the light-emitting and light-receiving element can be referred to for materials and the like of the layers included in the light-emitting elements.

Structure Example 2

Figure 14A:
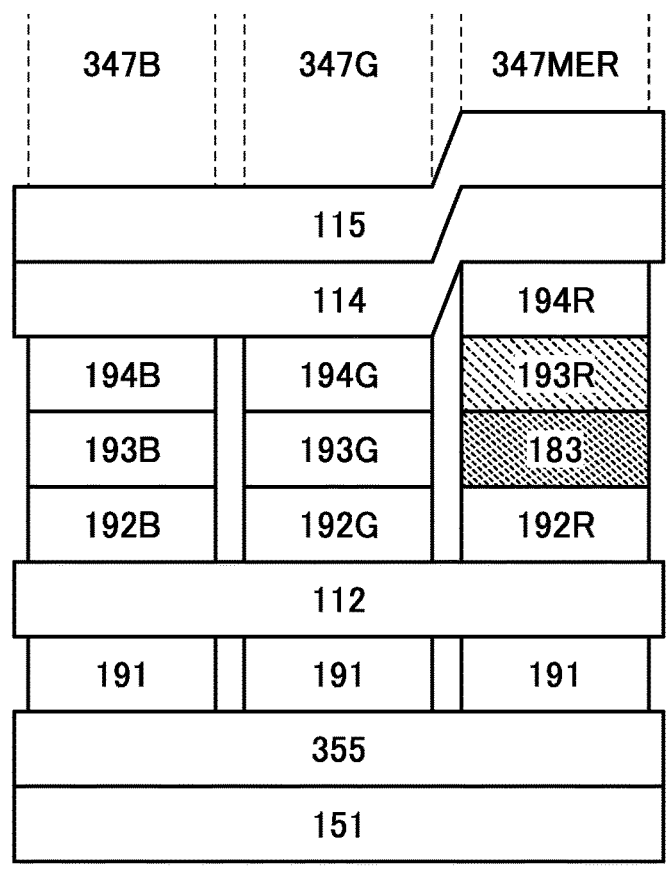
FIG. 14A and FIG. 14B are cross-sectional views illustrating examples of a display device.
Figure 14B:
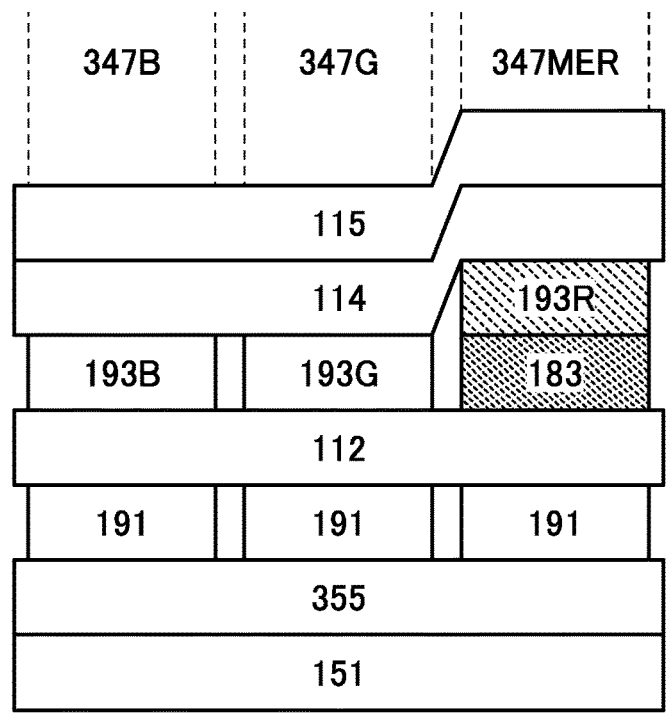

As illustrated in FIG. 14A and FIG. 14B, the light-emitting element 347B, the light-emitting element 347G, and the light-emitting and light-receiving element 347MER may include common layers between the pair of electrodes. Thus, the light-emitting and light-receiving element can be incorporated into the display device without a significant increase in the number of manufacturing steps.

The light-emitting element 347B, the light-emitting element 347G, and the light-emitting and light-receiving element 347MER illustrated in FIG. 14A include a common layer 112 and a common layer 114 in addition to the components illustrated in FIG. 13A and FIG. 13B.

The light-emitting element 347B, the light-emitting element 347G, and the light-emitting and light-receiving element 347MER illustrated in FIG. 14B are different from those illustrated in FIG. 13A and FIG. 13B in that the buffer layers 192R, 192G, and 192B and the buffer layers 194R, 194G, and 194B are not included and the common layer 112 and the common layer 114 are included.

The common layer 112 can include one or both of a hole-injection layer and a hole-transport layer. The common layer 114 can include one or both of an electron-injection layer and an electron-transport layer.

The common layer 112 and the common layer 114 may each have a single-layer structure or a stacked-layer structure.

Structure Example 3

Figure 15A:
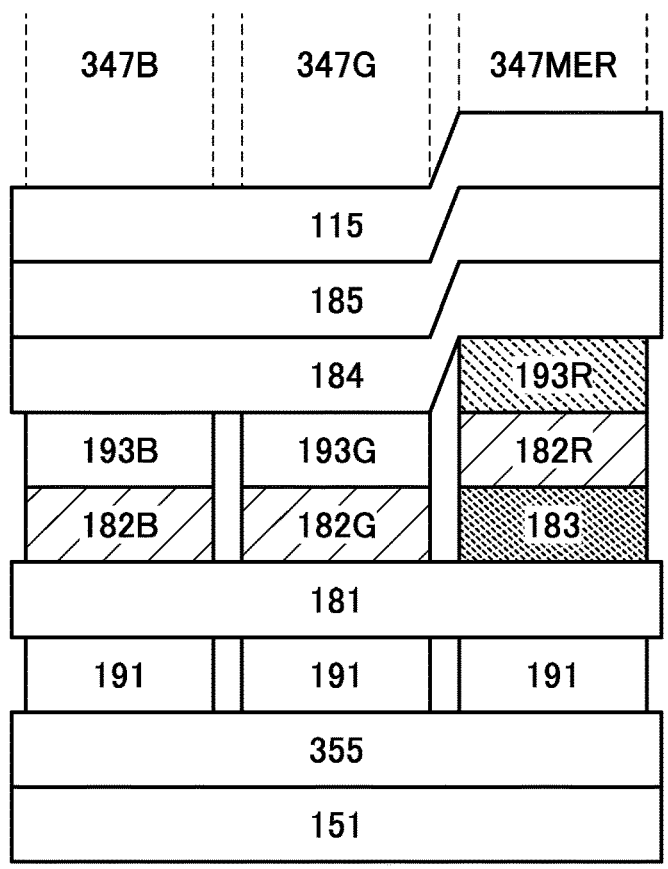
FIG. 15A and FIG. 15B are cross-sectional views illustrating examples of a display device.

The display device illustrated in FIG. 15A is an example in which the light-emitting and light-receiving element 347MER employs the layered structure illustrated in FIG. 12C.

The light-emitting and light-receiving element 347MER includes the hole-injection layer 181, the active layer 183, a hole-transport layer 182R, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, a hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, a hole-transport layer 182B, the light-emitting layer 193B, the electron-transport layer 184, the electron-injection layer 185, and the common electrode 115 in this order over the pixel electrode 191.

The light-emitting element included in the display device of this embodiment preferably employs a microcavity structure. In addition, the light-emitting and light-receiving element preferably also employs a microcavity structure. Thus, one of the pair of electrodes of the light-emitting element or the light-emitting and light-receiving elements is preferably an electrode having properties of transmitting and reflecting visible light (a transflective reflective electrode), and the other is preferably an electrode having a property of reflecting visible light (a reflective electrode). When the light-emitting element and the light-emitting and light-receiving element have a microcavity structure, light obtained from the light-emitting layers can be resonated between both of the electrodes, whereby light emitted from the light-emitting element or the light-emitting and light-receiving element can be intensified.

Note that the transflective electrode can have a stacked-layer structure of a reflective electrode and an electrode having a property of transmitting visible light (also referred to as a transparent electrode). In this specification and the like, a reflective electrode functioning as part of a transflective electrode may be referred to as a pixel electrode or a common electrode, and a transparent electrode may be referred to as an optical adjustment layer; however, in some cases, a transparent electrode (optical adjustment layer) can also be regarded as having a function of a pixel electrode or a common electrode.

The transparent electrode has a light transmittance higher than or equal to 40%. For example, an electrode whose transmittance for visible light (light with a wavelength greater than or equal to 400 nm and less than 750 nm) and near-infrared light (light with a wavelength greater than or equal to 750 nm and less than or equal to 1300 nm) is greater than or equal to 40% is preferably used in the light-emitting element. The reflectance of the transflective electrode for visible light and near-infrared light is greater than or equal to 10% and less than or equal to 95%, preferably greater than or equal to 30% and less than or equal to 80%. The reflectance of the reflective electrode for visible light and near-infrared light is greater than or equal to 40% and less than or equal to 100%, preferably greater than or equal to 70% and less than or equal to 100%. These electrodes preferably have a resistivity of $1 \times 10^{-2}$ Ωcm or lower.

The hole-transport layer 182B, the hole-transport layer 182G, and the hole-transport layer 182R may each have a function of an optical adjustment layer. Specifically, the thickness of the hole-transport layer 182B is preferably adjusted such that the optical distance between the pair of electrodes in the light-emitting element 347B intensifies blue light. Similarly, the thickness of the hole-transport layer 182G is preferably adjusted such that the optical distance between the pair of electrodes in the light-emitting element 347G intensifies green light. The thickness of the hole-transport layer 182R is preferably adjusted such that the optical distance between the pair of electrodes in the light-emitting and light-receiving element 347MER intensifies red light. The layer used as the optical adjustment layer is not limited to the hole-transport layer. Note that when the transflective electrode has a stacked-layer structure of a reflective electrode and a transparent electrode, the optical distance between the pair of electrodes represents the optical distance between a pair of reflective electrodes.

Structure Example 4

Figure 15B:
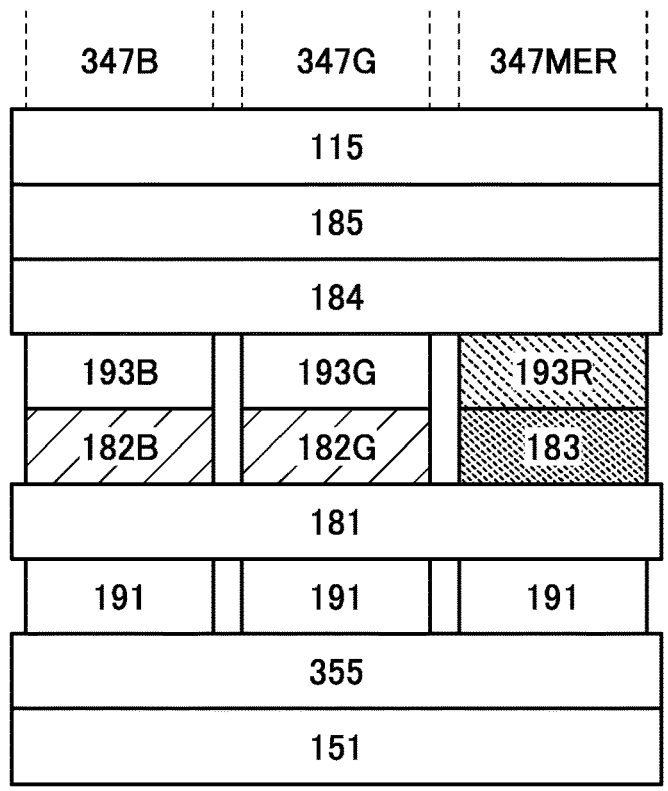

The display device illustrated in FIG. 15B is an example in which the light-emitting and light-receiving element 347MER employs the layered structure illustrated in FIG. 12D.

The light-emitting and light-receiving element 347MER includes the hole-injection layer 181, the active layer 183, the light-emitting layer 193R, the electron-transport layer 184, the electron-injection layer 185, and the common electrode 115 in this order over the pixel electrode 191.

The hole-injection layer 181, the electron-transport layer 184, the electron-injection layer 185, and the common electrode 115 are common layers to the light-emitting element 347G and the light-emitting element 347B.

The light-emitting element 347G includes the hole-injection layer 181, the hole-transport layer 182G, the light-emitting layer 193G, the electron-transport layer 184, the electron-injection layer 185, and the common electrode 115 in this order over the pixel electrode 191.

The light-emitting element 347B includes the hole-injection layer 181, the hole-transport layer 182B, the light-emitting layer 193B, the electron-transport layer 184, the electron-injection layer 185, and the common electrode 115 in this order over the pixel electrode 191.

The hole-transport layer is provided in the light-emitting element 347G and the light-emitting element 347B and is not provided in the light-emitting and light-receiving element 347MER. In this manner, a layer provided in only one of the light-emitting element and the light-emitting and light-receiving element may exist in addition to the active layer and the light-emitting layer.

A detailed structure of the display device of one embodiment of the present invention will be described below with reference to FIG. 16 to FIG. 21.

[Display Device 310A]

Figure 16A:
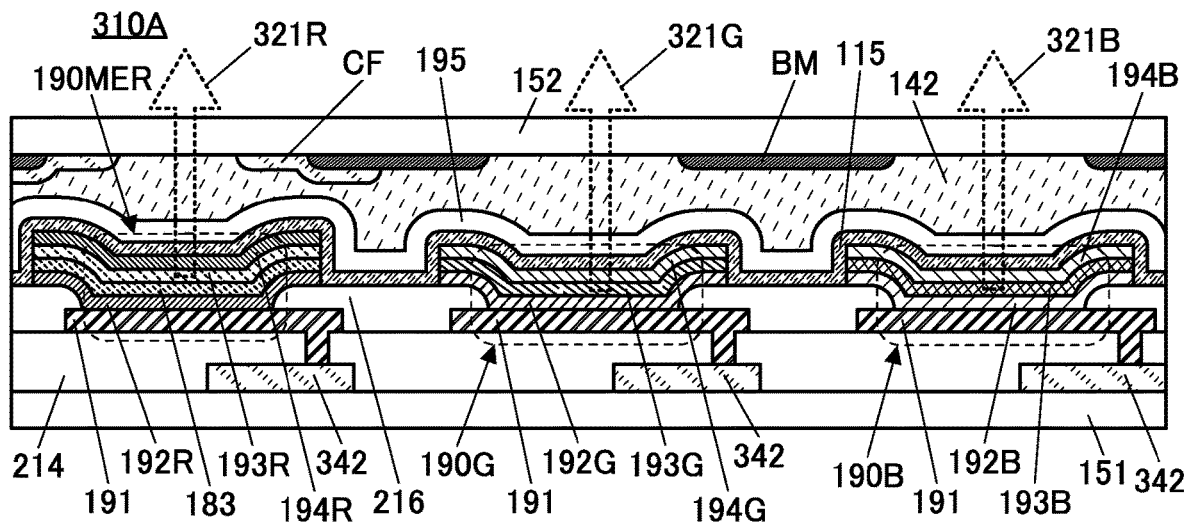
FIG. 16A and FIG. 16B are cross-sectional views illustrating an example of a display device.
Figure 16B:
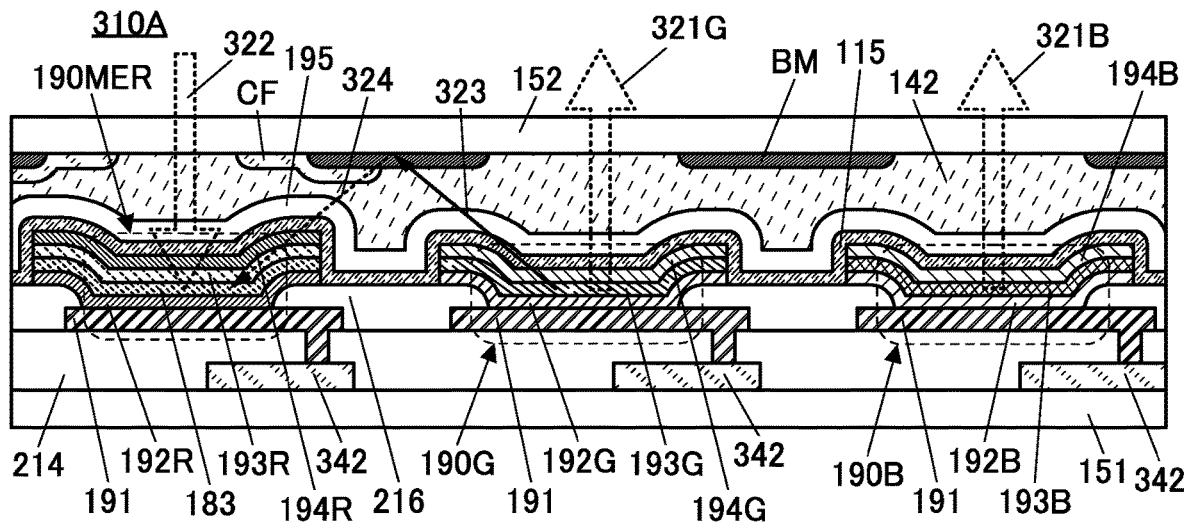

FIG. 16A and FIG. 16B are cross-sectional views of a display device 310A.

The display device 310A includes a light-emitting element 190B, a light-emitting element 190G, and a light-emitting and light-receiving element 190MER.

The light-emitting element 190B includes the pixel electrode 191, the buffer layer 192B, the light-emitting layer 193B, the buffer layer 194B, and the common electrode 115. The light-emitting element 190B has a function of emitting blue light 321B.

The light-emitting element 190G includes the pixel electrode 191, the buffer layer 192G, the light-emitting layer 193G, the buffer layer 194G, and the common electrode 115. The light-emitting element 190G has a function of emitting green light 321G.

The light-emitting and light-receiving element 190MER includes the pixel electrode 191, the buffer layer 192R, the active layer 183, the light-emitting layer 193R, the buffer layer 194R, and the common electrode 115. The light-emitting and light-receiving element 190MER has a function of emitting red light 321R and a function of detecting light 322.

FIG. 16A shows the case where the light-emitting and light-receiving element 190MER functions as a light-emitting element. FIG. 16A illustrates an example in which the light-emitting element 190B emits blue light, the light-emitting element 190G emits green light, and the light-emitting and light-receiving element 190MER emits red light.

FIG. 16B shows the case where the light-emitting and light-receiving element 190MER functions as a light-receiving element. FIG. 16B illustrates an example in which the light-emitting and light-receiving element 190MER detects blue light emitted by the light-emitting element 190B and green light emitted by the light-emitting element 190G.

The pixel electrode 191 is positioned over an insulating layer 214. An end portion of the pixel electrode 191 is covered with a partition 216. Two adjacent pixel electrodes 191 are electrically insulated (electrically isolated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. A partition that blocks visible light may be provided in place of the partition 216.

The display device 310A includes the light-emitting and light-receiving element 190MER, the light-emitting element 190G, the light-emitting element 190B, a transistor 342, and the like between a pair of substrates (the substrate 151 and a substrate 152).

The light-emitting and light-receiving element 190MER has a function of sensing light. Specifically, the light-emitting and light-receiving element 190MER functions as a photoelectric conversion element that receives the light 322 incident from the outside of the display device 310A and converts it into an electric signal. The light 322 can also be referred to as light that is emitted from one or both of the light-emitting element 190G and the light-emitting element 190B and then reflected by an object. The light 322 may enter the light-emitting and light-receiving element 190MER through a lens.

The light-emitting and light-receiving element 190MER, the light-emitting element 190G, and the light-emitting element 190B have a function of emitting visible light. Specifically, the light-emitting and light-receiving element 190MER, the light-emitting element 190G, and the light-emitting element 190B each function as an electroluminescent element that emits light to the substrate 152 side by voltage application between the pixel electrode 191 and the common electrode 115 (see the light 321R, the light 321G, and the light 321B).

The buffer layer 192, the light-emitting layer 193, and the buffer layer 194 can also be referred to as organic layers (layers containing an organic compound) or EL layers. The pixel electrode 191 preferably has a function of reflecting visible light. The common electrode 115 has a function of transmitting visible light.

The pixel electrode 191 is electrically connected to a source or a drain of the transistor 342 through an opening provided in the insulating layer 214. The transistor 342 has a function of controlling the driving of the light-emitting element or the light-emitting and light-receiving element.

At least part of a circuit electrically connected to the light-emitting and light-receiving element 190MER is preferably formed using the same material in the same steps as a circuit electrically connected to the light-emitting element 190G and the light-emitting element 190B. In that case, the thickness of the display device can be reduced compared with the case where the two circuits are separately formed, resulting in simplification of the manufacturing process.

The light-emitting and light-receiving element 190MER, the light-emitting element 190G, and the light-emitting element 190B are preferably covered with a protective layer 195. In FIG. 16A and the like, the protective layer 195 is provided over and in contact with the common electrode 115. Providing the protective layer 195 can inhibit entry of impurities into the light-emitting and light-receiving element 190MER and the light-emitting elements of different colors and improve the reliabilities of the light-emitting and light-receiving element 190MER and the light-emitting elements of the different colors. The protective layer 195 and the substrate 152 are bonded to each other with an adhesive layer 142.

A light-blocking layer BM is provided on a surface of the substrate 152 that faces the substrate 151. The light-blocking layer BM has openings at positions overlapping the light-emitting element 190G and the light-emitting element 190B and a position overlapping the light-emitting and light-receiving element 190MER. Note that in this specification and the like, the position overlapping the light-emitting element 190G or the light-emitting element 190B refers specifically to a position overlapping a light-emitting region of the light-emitting element 190G or the light-emitting element 190B. Similarly, the position overlapping the light-emitting and light-receiving element 190MER refers specifically to a position overlapping a light-emitting region and a light-receiving region of the light-emitting and light-receiving element 190MER.

As illustrated in FIG. 16B, the light-emitting and light-receiving element 190MER is capable of sensing light that is emitted from the light-emitting element 190G or the light-emitting element 190B and then reflected by an object. However, in some cases, light emitted from the light-emitting element 190G or the light-emitting element 190B is reflected inside the display device 310A and enters the light-emitting and light-receiving element 190MER without involving an object. The light-blocking layer BM can reduce the influence of such stray light. For example, in the case where the light-blocking layer BM is not provided, light 323 emitted from the light-emitting element 190G is reflected by the substrate 152 and reflected light 324 enters the light-emitting and light-receiving element 190MER in some cases. Providing the light-blocking layer BM can inhibit the reflected light 324 from entering the light-emitting and light-receiving element 190MER. Consequently, noise can be reduced, and the sensitivity of a sensor using the light-emitting and light-receiving element 190MER can be increased.

For the light-blocking layer BM, a material that blocks light emitted from the light-emitting elements can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

A surface of the substrate 152 on the substrate 151 side is provided with a color filter CF. The color filter CF includes a portion positioned in the inside of the opening portion overlapping with the light-emitting and light-receiving element 190MER of the light-blocking layer BM in the plan view. Furthermore, the color filter CF includes an opening portion in a position overlapping with the light-emitting and light-receiving element 190MER. The color filter CF has a function of transmitting the light 321R emitted by the light-emitting and light-receiving element 190MER and blocking (absorbing or reflecting) the light 321G emitted by the light-emitting element 190G and the light 321B emitted by the light-emitting element 190B.

[Display Device 310B]

Figure 17A:
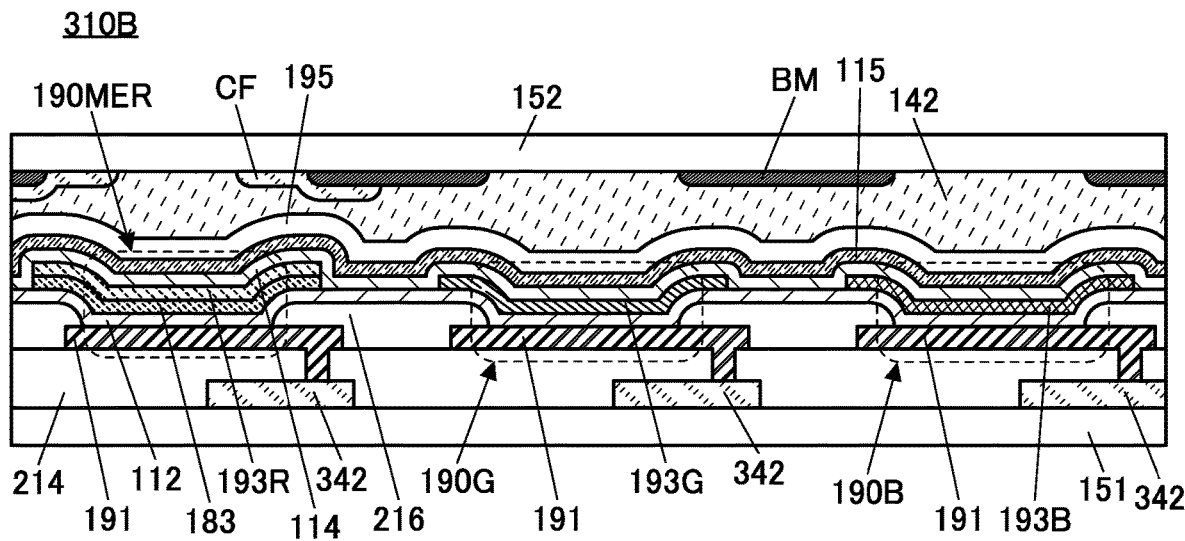
FIG. 17A and FIG. 17B are cross-sectional views illustrating examples of a display device.

A display device 310B illustrated in FIG. 17A is different from the display device 310A in that each of the light-emitting element 190G, the light-emitting element 190B, and the light-emitting and light-receiving element 190MER does not include the buffer layer 192 and the buffer layer 194 and includes the common layer 112 and the common layer 114. Note that in the following description of the display device, components similar to those of the above-mentioned display device are not described in some cases.

Note that the layered structure of the light-emitting element 190B, the light-emitting element 190G, and the light-emitting and light-receiving element 190MER is not limited to the structures in the display devices 310A and 310B. For example, any of the layered structures illustrated in FIG. 12A to FIG. 15B can be appropriately used for each element.

[Display Device 310C]

Figure 17B:
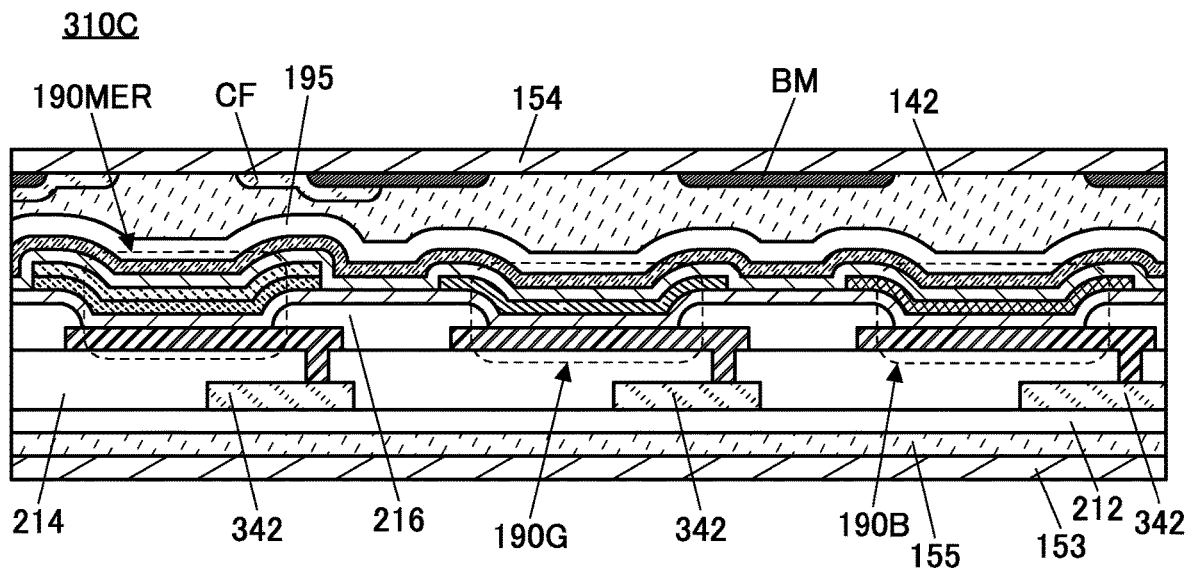

A display device 310C illustrated in FIG. 17B is different from the display device 310B in that the substrate 151 and the substrate 152 are not included but a substrate 153, a substrate 154, an adhesive layer 155, and an insulating layer 212 are included.

The substrate 153 and the insulating layer 212 are bonded to each other with the adhesive layer 155. The substrate 154 and the protective layer 195 are bonded to each other with the adhesive layer 142.

The display device 310C has a structure obtained in such a manner that the insulating layer 212, the transistor 342, the light-emitting and light-receiving element 190MER, the light-emitting element 190G, the light-emitting element 190B, and the like are formed over a formation substrate and then transferred onto the substrate 153. The substrate 153 and the substrate 154 preferably have flexibility. Accordingly, the flexibility of the display device 310C can be increased. For example, a resin is preferably used for the substrate 153 and the substrate 154.

For the substrate 153 and the substrate 154, it is possible to use, for example, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber. Glass that is thin enough to have flexibility may be used for one or both of the substrate 153 and the substrate 154.

As the substrate included in the display device of this embodiment, a film having high optical isotropy may be used. Examples of the film having high optical isotropy include a triacetyl cellulose (TAC, also referred to as cellulose triacetate) resin film, a cycloolefin polymer (COP) film, a cycloolefin copolymer (COC) film, and an acrylic resin film.

A more detailed structure of the display device of one embodiment of the present invention will be described below.

[Display Device 100A]

Figure 18:
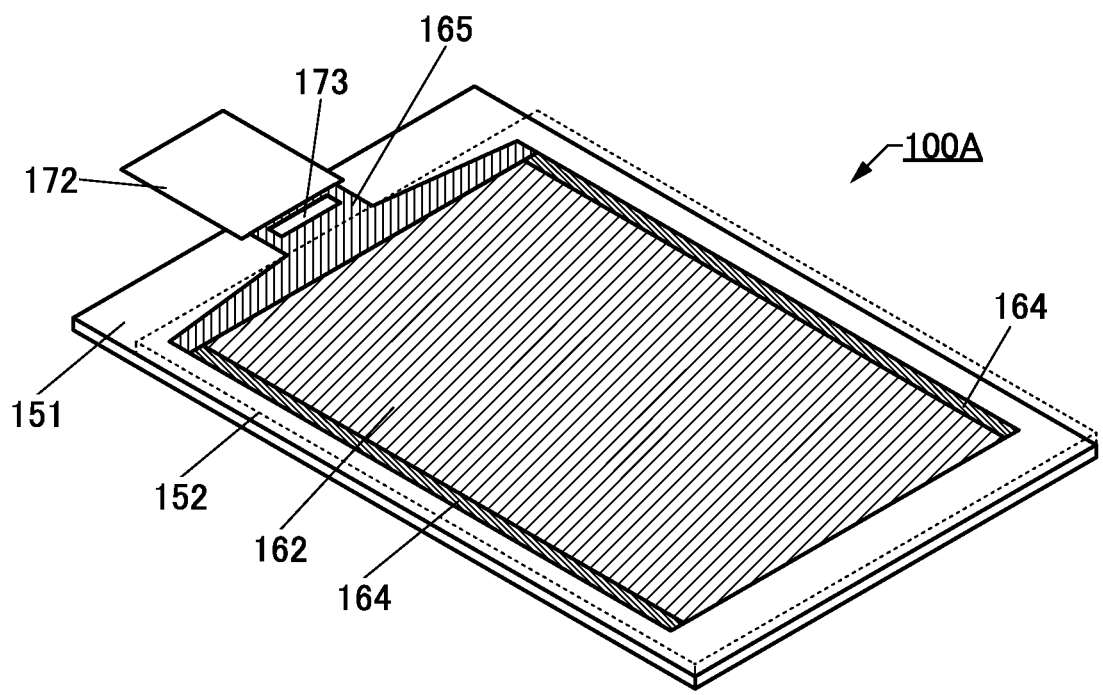
FIG. 18 is a perspective view illustrating an example of a display device.
Figure 19:
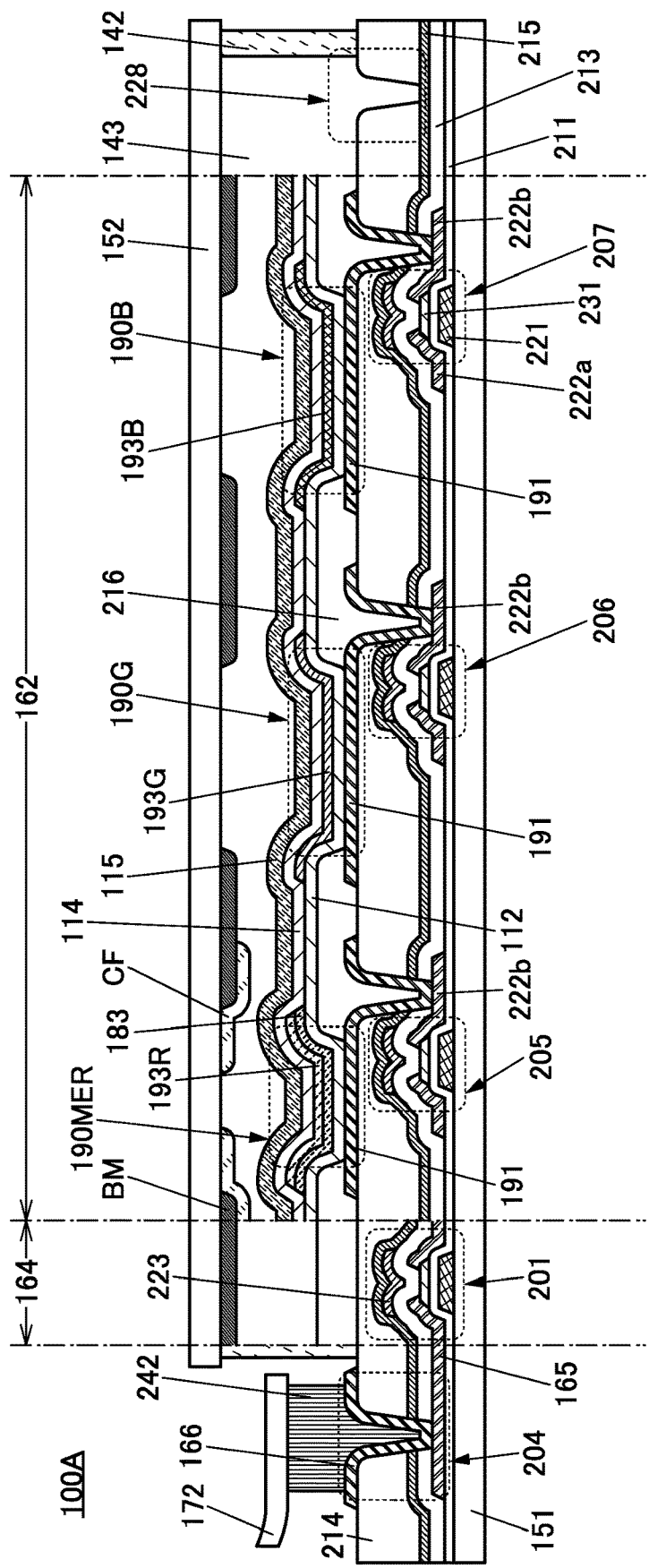
FIG. 19 is a cross-sectional view illustrating an example of a display device.

FIG. 18 is a perspective view of a display device 100A, and FIG. 19 is a cross-sectional view of the display device 100A.

The display device 100A has a structure in which the substrate 152 and the substrate 151 are bonded to each other. In FIG. 18, the substrate 152 is denoted by a dashed line.

The display device 100A includes a display portion 162, a circuit 164, a wiring 165, and the like. FIG. 18 illustrates an example in which the display device 100A is provided with an IC (integrated circuit) 173 and an FPC 172. Thus, the structure illustrated in FIG. 18 can be regarded as a display module including the display device 100A, the IC, and the FPC.

As the circuit 164, for example, a scan line driver circuit can be used.

The wiring 165 has a function of supplying a signal and power to the display portion 162 and the circuit 164. The signal and power are input to the wiring 165 from the outside through the FPC 172 or input to the wiring 165 from the IC 173.

FIG. 18 illustrates an example in which the IC 173 is provided over the substrate 151 by a COG (Chip On Glass) method, a COF (Chip on Film) method, or the like. An IC including a scan line driver circuit or a signal line driver circuit, for example, can be used as the IC 173. Note that the display device 100A and the display module may have a structure not including an IC. The IC may be mounted on the FPC by a COF method or the like.

FIG. 19 illustrates an example of cross sections of part of a region including the FPC 172, part of a region including the circuit 164, part of a region including the display portion 162, and part of a region including an end portion of the display device 100A illustrated in FIG. 18.

The display device 100A in FIG. 19 includes a transistor 201, a transistor 205, a transistor 206, a transistor 207, the light-emitting element 190B, the light-emitting element 190G, the light-emitting and light-receiving element 190MER, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190B, the light-emitting element 190G, and the light-emitting and light-receiving element 190MER. In FIG. 19, a hollow sealing structure is employed in which a space 143 surrounded by the substrate 152, the adhesive layer 142, and the insulating layer 214 is filled with an inert gas (e.g., nitrogen or argon). The adhesive layer 142 may be provided to overlap the light-emitting element 190B, the light-emitting element 190G, and the light-emitting and light-receiving element 190MER. The space 143 surrounded by the substrate 152, the adhesive layer 142, and the insulating layer 214 may be filled with a resin different from that of the adhesive layer 142.

The light-emitting element 190B has a layered structure in which the pixel electrode 191, the common layer 112, the light-emitting layer 193B, the common layer 114, and the common electrode 115 are stacked in this order from the insulating layer 214 side. The pixel electrode 191 is connected to a conductive layer 222b included in the transistor 207 through an opening provided in the insulating layer 214. The transistor 207 has a function of controlling the driving of the light-emitting element 190B. The end portion of the pixel electrode 191 is covered with the partition 216. The pixel electrode 191 contains a material that reflects visible light, and the common electrode 115 contains a material that transmits visible light.

The light-emitting element 190G has a layered structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 206 through an opening provided in the insulating layer 214. The transistor 206 has a function of controlling the driving of the light-emitting element 190G.

The light-emitting and light-receiving element 190MER has a layered structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 205 through an opening provided in the insulating layer 214. The transistor 205 has a function of controlling the driving of the light-emitting and light-receiving element 190MER.

Light emitted from the light-emitting element 190B, the light-emitting element 190G, and the light-emitting and light-receiving element 190MER is emitted toward the substrate 152. Light enters the light-emitting and light-receiving element 190MER through the substrate 152 and the space 143. For the substrate 152, a material that has high transmittance with respect to visible light is preferably used.

The pixel electrodes 191 can be formed using the same material in the same step. The common layer 112, the common layer 114, and the common electrode 115 are used in common in the light-emitting element 190B, the light-emitting element 190G, and the light-emitting and light-receiving element 190MER. The light-emitting and light-receiving element 190MER has the structure of a red-light-emitting element to which the active layer 183 is added. Alternatively, the light-emitting element 190B, the light-emitting element 190G, and the light-emitting and light-receiving element 190MER can have a common structure except for the active layer 183 and the light-emitting layer 193 of each color. Thus, the display portion 162 of the display device 100A can have a light-receiving function without a significant increase in the number of manufacturing steps.

A surface of the substrate 152 on the substrate 151 side is provided with the light-blocking layer BM. The light-blocking layer BM includes openings at positions overlapping the light-emitting element 190B, the light-emitting element 190G, and the light-emitting and light-receiving element 190MER. Providing the light-blocking layer BM can control the range where the light-emitting and light-receiving element 190MER senses light. Furthermore, with the light-blocking layer BM, light can be prevented from directly entering the light-emitting and light-receiving element 190MER from the light-emitting element 190G or the light-emitting element 190B without involving any object. Hence, a sensor with less noise and high sensitivity can be obtained.

The surface of the substrate 152 on the substrate 151 side is provided with the color filter CF. The color filter CF includes an opening portion in a position overlapping with the light-emitting and light-receiving element 190MER.

The transistor 201, the transistor 205, the transistor 206, and the transistor 207 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may be either a single layer or two or more layers.

A material into which impurities such as water or hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like, which is an inorganic insulating film, can be used. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display device 100A. This can inhibit entry of impurities from the end portion of the display device 100A through the organic insulating film. Alternatively, the organic insulating film may be formed so that an end portion of the organic insulating film is positioned on the inner side compared to the end portion of the display device 100A, to prevent the organic insulating film from being exposed at the end portion of the display device 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 19, an opening is formed in the insulating layer 214. This can inhibit entry of impurities into the display portion 162 from the outside through the insulating layer 214 even when an organic insulating film is used as the insulating layer 214. Thus, the reliability of the display device 100A can be increased.

The transistor 201, the transistor 205, the transistor 206, and the transistor 207 each include a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors; any of an amorphous semiconductor, a single crystal semiconductor, and a semiconductor having crystallinity (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature polysilicon and single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer. Alternatively, it is preferable to use an oxide containing indium, gallium, zinc, and tin. Alternatively, it is preferable to use an oxide containing indium, tin, and zinc.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=10:1:3 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

Note that when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that is not overlapped by the substrate 152. In the connection portion 204, the wiring 165 is electrically connected to the FPC 172 through a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the display device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, or tungsten, and an alloy containing any of these metals as its main component. A film containing any of these materials can be used as a single layer or in a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, an alloy material containing the metal material, or the like can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium is preferably used, in which case the conductivity can be increased. These materials can also be used for conductive layers such as a variety of wirings and electrodes included in a display device, or conductive layers (conductive layers functioning as a pixel electrode, a common electrode, or the like) included in a light-emitting element and a light-emitting and light-receiving element.

Examples of an insulating material that can be used for each insulating layer include a resin such as an acrylic resin and an epoxy resin, and an inorganic insulating material such as silicon oxide, silicon oxynitride, silicon nitride oxide, silicon nitride, and aluminum oxide.

[Display Device 100B]

Figure 20:
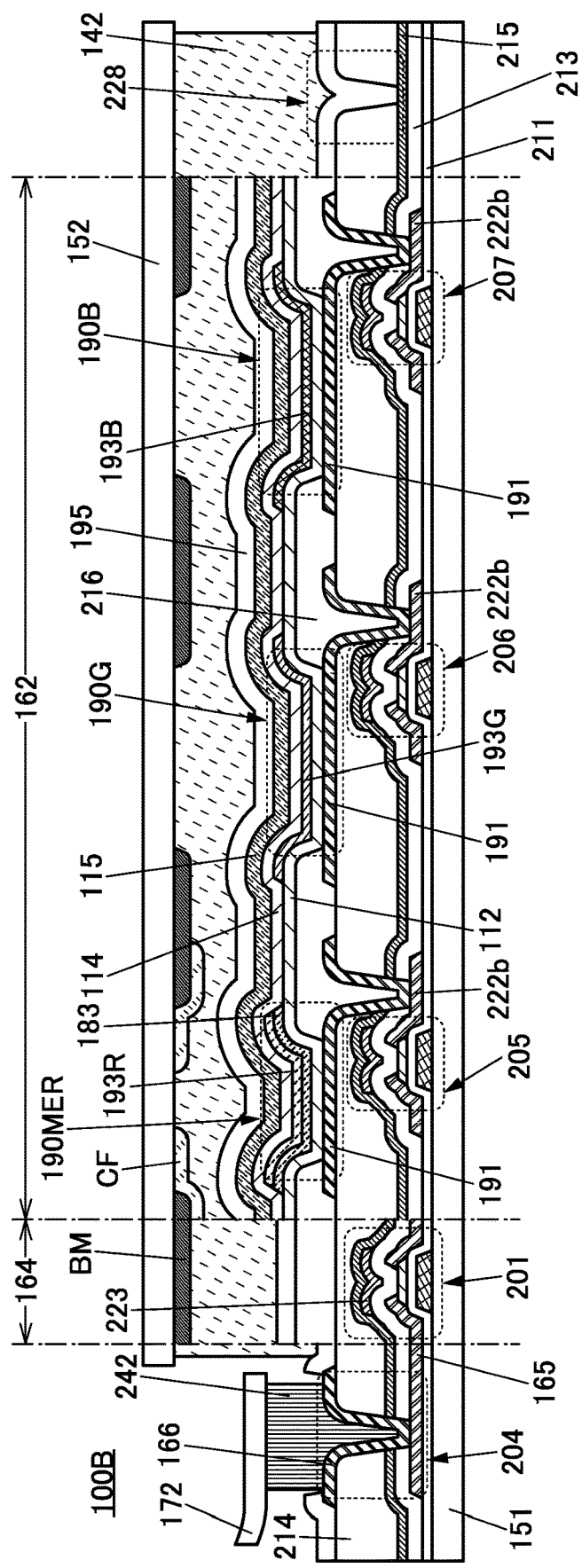
FIG. 20 is a cross-sectional view illustrating an example of a display device.

FIG. 20 is a cross-sectional view of a display device 100B.

The display device 100B is different from the display device 100A mainly in including the protective layer 195. Detailed description of a structure similar to that of the display device 100A is omitted.

Providing the protective layer 195 that covers the light-emitting element 190B, the light-emitting element 190G, and the light-emitting and light-receiving element 190MER can inhibit entry of impurities such as water into the light-emitting element 190B, the light-emitting element 190G, and the light-emitting and light-receiving element 190MER, leading to an increase in the reliability of the light-emitting element 190B, the light-emitting element 190G, and the light-emitting and light-receiving element 190MER.

In the region 228 in the vicinity of an end portion of the display device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the display portion 162 through the organic insulating film can be inhibited. Consequently, the reliability of the display device 100B can be increased.

The protective layer 195 may have a single-layer structure or a stacked-layer structure; for example, the protective layer 195 may have a three-layer structure that includes an inorganic insulating layer over the common electrode 115, an organic insulating layer over the inorganic insulating layer, and an inorganic insulating layer over the organic insulating layer. In that case, an end portion of the inorganic insulating film preferably extends beyond an end portion of the organic insulating film.

Furthermore, a lens may be provided in a region overlapping the light-emitting and light-receiving element 190MER. Thus, the sensitivity and accuracy of a sensor using the light-emitting and light-receiving element 190MER can be increased.

The lens preferably has a refractive index greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

In the display device 100B, the protective layer 195 and the substrate 152 are bonded to each other with the adhesive layer 142. The adhesive layer 142 is provided to overlap the light-emitting element 190B, the light-emitting element 190G, and the light-emitting and light-receiving element 190MER; that is, the display device 100B employs a solid sealing structure.

[Display Device 100C]

Figures 21A, 21B:
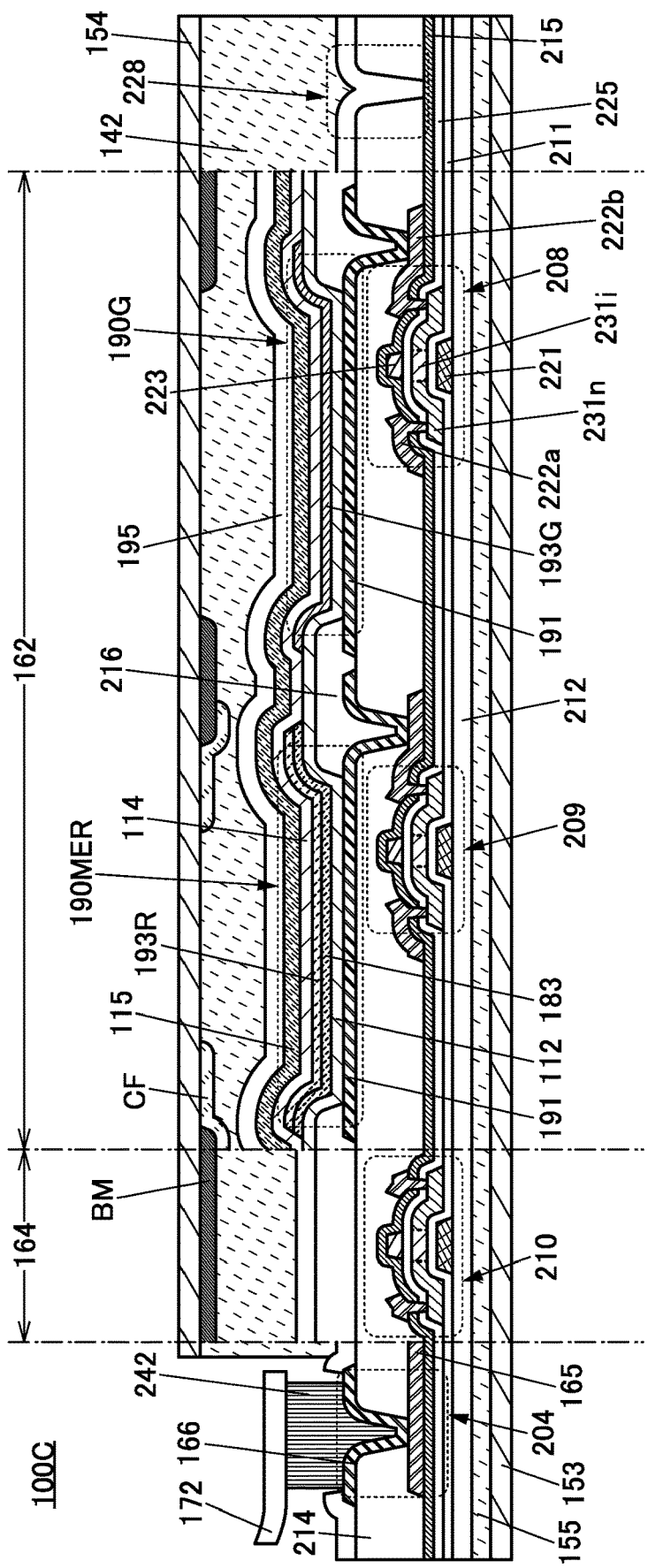
FIG. 21A is a cross-sectional view illustrating an example of a display device.
FIG. 21B is a cross-sectional view illustrating an example of a transistor.

FIG. 21A is a cross-sectional view of a display device 100C.

The display device 100C is different from the display device 100B in transistor structures.

The display device 100C includes a transistor 208, a transistor 209, and a transistor 210 over the substrate 153.

The transistor 208, the transistor 209, and the transistor 210 each include the conductive layer 221 functioning as a gate, the insulating layer 211 functioning as a gate insulating layer, a semiconductor layer including a channel formation region 231$i$ and a pair of low-resistance regions 231$n$, the conductive layer 222$a$ connected to one of the pair of low-resistance regions 231$n$, the conductive layer 222$b$ connected to the other of the pair of low-resistance regions 231$n$, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231$i$. The insulating layer 225 is positioned between the conductive layer 223 and the channel formation region 231$i$.

The conductive layer 222$a$ and the conductive layer 222$b$ are connected to the corresponding low-resistance regions 23 In through openings provided in the insulating layer 225 and the insulating layer 215. One of the conductive layer 222$a$ and the conductive layer 222$b$ serves as a source, and the other serves as a drain.

The pixel electrode 191 of the light-emitting element 190G is electrically connected to one of the pair of low-resistance regions 23 In of the transistor 208 through the conductive layer 222$b$ The pixel electrode 191 of the light-emitting and light-receiving element 190MER is electrically connected to the other of the pair of low-resistance regions 23 In of the transistor 209 through the conductive layer 222$b$.

FIG. 21A illustrates an example in which the insulating layer 225 covers the top surface and a side surface of the semiconductor layer. Meanwhile, in a transistor 202 illustrated in FIG. 21B, the insulating layer 225 overlaps the channel formation region 231$i$ of the semiconductor layer 231 and does not overlap the low-resistance regions 231$n$. The structure illustrated in FIG. 21B can be obtained by processing the insulating layer 225 using the conductive layer 223 as a mask, for example. In FIG. 21B, the insulating layer 215 is provided to cover the insulating layer 225 and the conductive layer 223, and the conductive layer 222$a$ and the conductive layer 222$b$ are connected to the low-resistance regions 231$n$ through openings in the insulating layer 215. Furthermore, an insulating layer 218 covering the transistor may be provided.

In addition, the display device 100C is different from the display device 100B in that neither the substrate 151 nor the substrate 152 is included and the substrate 153, the substrate 154, the adhesive layer 155, and the insulating layer 212 are included.

The substrate 153 and the insulating layer 212 are bonded to each other with the adhesive layer 155. The substrate 154 and the protective layer 195 are bonded to each other with the adhesive layer 142.

The display device 100C is formed in such a manner that the insulating layer 212, the transistor 208, the transistor 209, the transistor 210, the light-emitting and light-receiving element 190MER, the light-emitting element 190G, and the like which are formed over a formation substrate are transferred onto the substrate 153. The substrate 153 and the substrate 154 preferably have flexibility. Accordingly, the flexibility of the display device 100C can be increased.

The inorganic insulating film that can be used as the insulating layer 211, the insulating layer 213, and the insulating layer 215 can be used as the insulating layer 212.

In the display device of this embodiment, a subpixel exhibiting light of any of the colors includes a light-emitting and light-receiving element instead of a light-emitting element as described above. The light-emitting and light-receiving element functions as both a light-emitting element and a light-receiving element, whereby the pixel can have a light-receiving function without an increase in the number of subpixels included in the pixel. Moreover, the pixel can have a light-receiving function without a reduction in the resolution of the display device, the aperture ratio of each subpixel, and the like.

At least part of the configuration examples, the drawings corresponding thereto, and the like shown in this embodiment as an example can be implemented in combination with the other configuration examples, the other drawings, and the like as appropriate.

At least part of this embodiment can be implemented in combination with the other embodiments described in this specification as appropriate.

Embodiment 3

Described in this embodiment is a metal oxide (also referred to as an oxide semiconductor) that can be used in an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including a completely amorphous structure), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be analyzed with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible; for example, the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (On/Off function). A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

A transistor using a CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 4

In this embodiment, electronic devices of embodiments of the present invention will be described.

An electronic device in this embodiment includes the display device of one embodiment of the present invention. For example, the display device of one embodiment of the present invention can be used in a display portion of the electronic device. The display device of one embodiment of the present invention has a function of sensing light, and thus can perform biological authentication with the display portion or detect a touch operation (a contact or an approach). Consequently, the electronic device can have improved functionality and convenience, for example.

Examples of electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 22A:
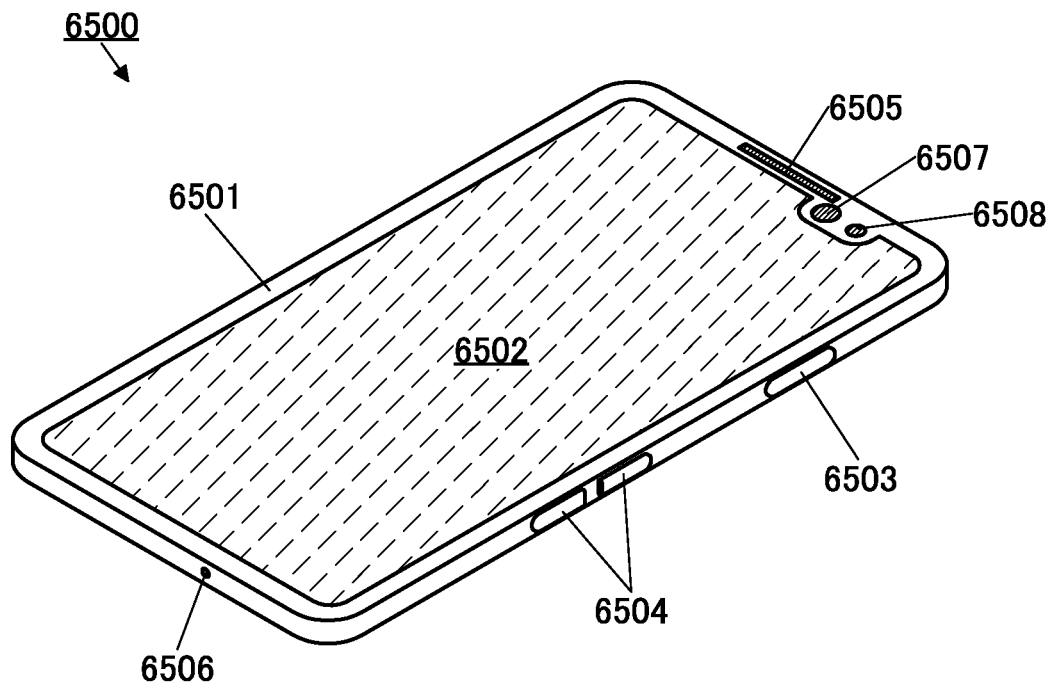
FIG. 22A and FIG. 22B are diagrams illustrating an example of an electronic device.

An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 22B:
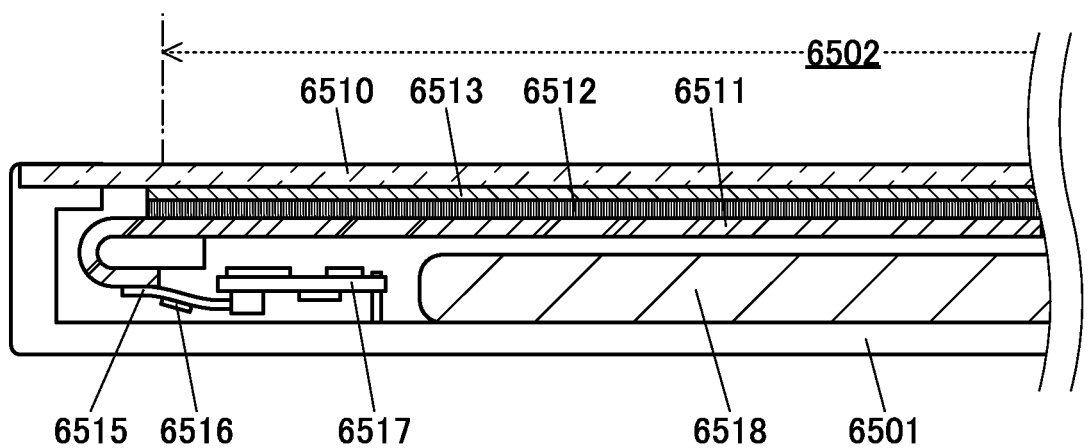

FIG. 22B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display device of one embodiment of the present invention as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

Figure 23A:
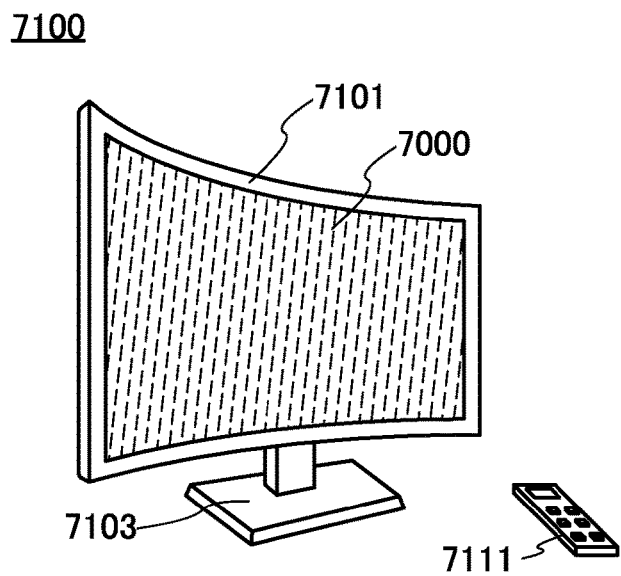
FIG. 23A to FIG. 23D are diagrams illustrating examples of an electronic device.

FIG. 23A illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 23A can be performed with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may include a display portion for displaying information output from the remote controller 7111. With operation keys or a touch panel provided in the remote controller 7111, channels and volume can be controlled, and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 23B:
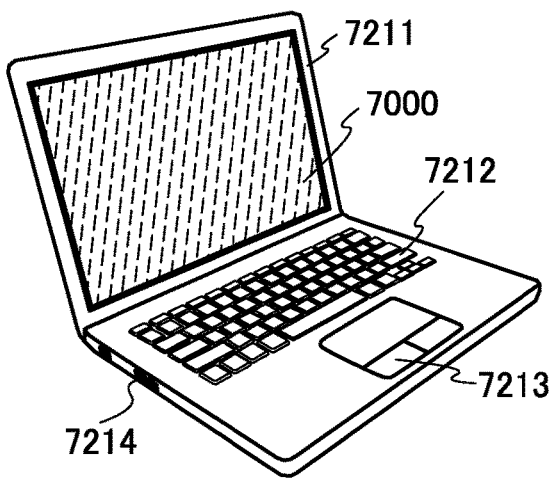

FIG. 23B illustrates an example of a laptop personal computer. A laptop personal computer 7200 includes a housing 7211, a keyboard 7212, a pointing device 7213, an external connection port 7214, and the like. The display portion 7000 is incorporated in the housing 7211. The display device of one embodiment of the present invention can be used in the display portion 7000.

Figure 23C:
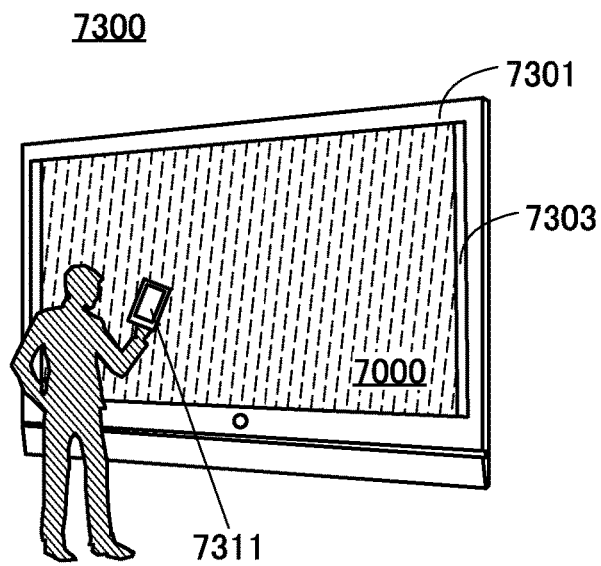
Figure 23D:
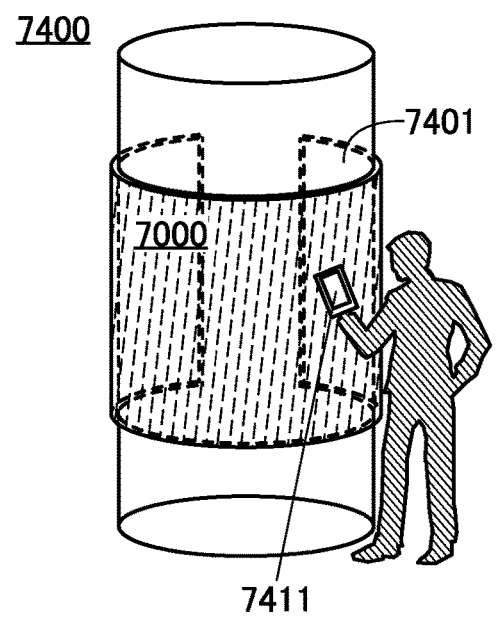

FIG. 23C and FIG. 23D illustrate examples of digital signage.

Digital signage 7300 illustrated in FIG. 23C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 23D shows digital signage 7400 attached to a cylindrical pillar 7401. The digital signage 7400 includes the display portion 7000 provided along a curved surface of the pillar 7401.

The display device of one embodiment of the present invention can be used in the display portion 7000 in FIG. 23C and FIG. 23D.

A larger area of the display portion 7000 can increase the amount of information that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 23C and FIG. 23D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 24A to FIG. 24F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 24A to FIG. 24F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 24A to FIG. 24F are described below.

Figure 24A:
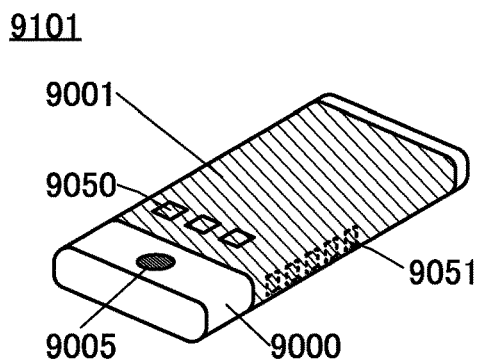
FIG. 24A to FIG. 24F are diagrams illustrating examples of an electronic device.

FIG. 24A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters, image information, or the like on its plurality of surfaces. FIG. 24A shows an example where three icons 9050 are displayed. Information 9051 indicated by dashed rectangles can be displayed on another surface of the display portion 9001. Examples of the information 9051 include notification of reception of an e-mail, SNS, an incoming call, or the like, the title and sender of an e-mail, SNS, or the like, the date, the time, remaining battery, and the reception strength of an antenna. Alternatively, the icon 9050 or the like may be displayed at the position where the information 9051 is displayed.

Figure 24B:
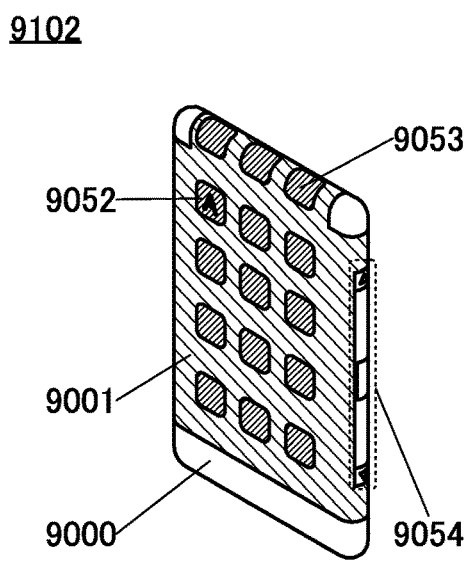

FIG. 24B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed at a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 24C:
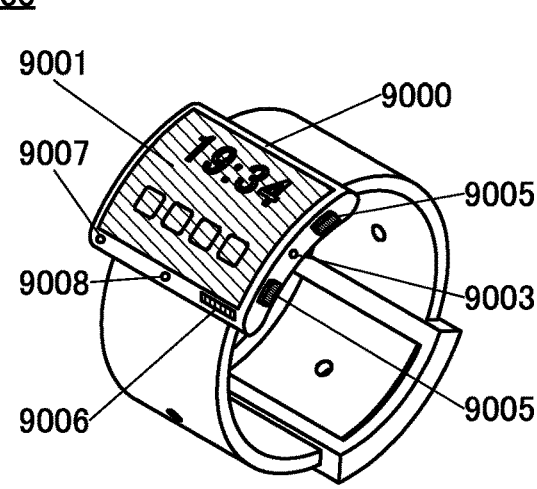

FIG. 24C is a perspective view illustrating a watch-type portable information terminal 9200. The display portion 9001 is provided such that its display surface is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal or charging. Note that the charging operation may be performed by wireless power feeding.

Figure 24D:
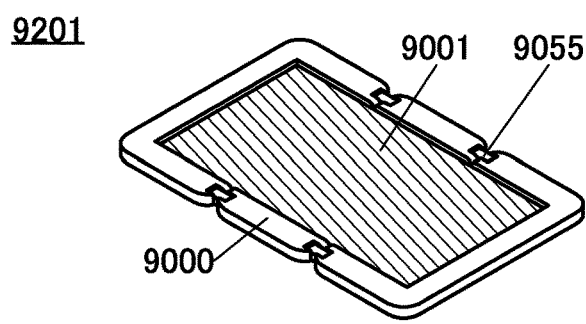
Figure 24E:
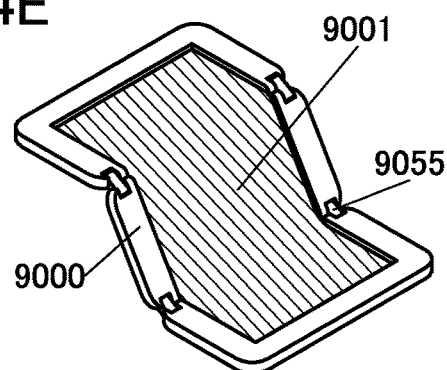
Figure 24F:
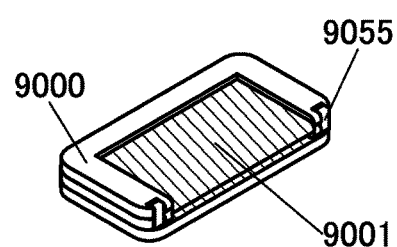

FIG. 24D to FIG. 24F are perspective views illustrating a foldable portable information terminal 9201. FIG. 24D is a perspective view of an opened state of the portable information terminal 9201, FIG. 24F is a perspective view of a folded state thereof, and FIG. 24E is a perspective view of a state in the middle of change from one of FIG. 24D and FIG. 24F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification as appropriate.

REFERENCE NUMERALS

10, 10*a* to 10*i*: display device 11, 12: substrate 15: element layer 16: functional layer 19: scatterer 20*h*: opening portion 20: light-emitting and light-receiving element 21: conductive layer 22: organic layer 23: conductive layer 29: structure 30G, 30Ga, 30Gb, 30R: light 30Ref: scattered light 31: color filter 32: light-blocking layer 41: insulating layer 42: adhesive layer 50B, 50G: light-emitting element 51: conductive layer 52: organic layer 60*a* to 60*c*: pixel 61: space

The invention claimed is:

1. A display device comprising:
   a light-emitting and light-receiving element over a first substrate; and
   a color filter above the light-emitting and light-receiving element,
   wherein the light-emitting and light-receiving element comprises a light-emitting and light-receiving region configured to emit light of a first color and receive light of a second color,
   wherein the light-emitting and light-receiving element includes at least an EL layer and a photoelectric conversion layer between a pixel electrode and a common electrode,
   wherein the color filter is configured to transmit the light of the first color and block the light of the second color,
   wherein the color filter comprises an opening over the light-emitting and light-receiving region, and
   wherein in a plan view, the light-emitting and light-receiving region comprises a portion located inside the opening.

2. The display device according to claim 1,
   wherein in the plan view, a portion of the color filter and an end portion of the light-emitting and light-receiving region overlap with each other.

3. The display device according to claim 1,
   wherein in the plan view, an end portion of the light-emitting and light-receiving region is located inside the opening and a space is provided between the light-emitting and light-receiving region and the color filter.

4. The display device according to claim 1, further comprising a light-blocking layer above the light-emitting and light-receiving element,
   wherein the light-blocking layer is configured to block the light of the first color and the light of the second color,
   wherein in the plan view, the light-blocking layer is located outside the opening of the color filter,
   wherein the color filter comprises a first portion and a second portion,
   wherein in the plan view, the first portion overlaps with the light-blocking layer, and
   wherein in the plan view, the second portion is positioned between the first portion and the opening and overlapping with neither the light-blocking layer nor the light-emitting and light-receiving element.

5. A display module comprising the display device according to claim 1, and a connector or an integrated circuit.

6. An electronic device comprising:
   the display module according to claim 5; and
   at least one of an antenna, a battery, a housing, a camera, a speaker, a microphone, a touch sensor, and an operation button.

7. A display device comprising:
   a light-emitting and light-receiving element over a first substrate;
   a first color filter above the light-emitting and light-receiving element; and
   a light-emitting element provided adjacent to the light-emitting and light-receiving element,
   wherein the light-emitting and light-receiving element comprises a light-emitting and light-receiving region configured to emit light of a first color and receive light of a second color,
   wherein the light-emitting and light-receiving element includes at least an EL layer and a photoelectric conversion layer between a pixel electrode and a common electrode,
   wherein the light-emitting element is configured to emit the light of the second color,
   wherein the first color filter is configured to transmit the light of the first color and block the light of the second color,
   wherein the first color filter comprises an opening, and
   wherein in a plan view, the light-emitting and light-receiving region comprises a portion located inside the opening.

8. The display device according to claim 7, further comprising a light-blocking layer above the light-emitting and light-receiving element and the light-emitting element,
   wherein in a plan view, the light-blocking layer is positioned between the light-emitting and light-receiving element and the light-emitting element, and
   wherein, in the plan view, the light-blocking layer does not overlap with the light-emitting element and a space is provided between an end portion of the light-blocking layer and an end portion of the light-emitting element.

9. The display device according to claim 7,
   wherein in the plan view, a portion of the first color filter and an end portion of the light-emitting and light-receiving region overlap with each other.

10. The display device according to claim 7,
wherein in the plan view, an end portion of the light-emitting and light-receiving region is located inside the opening and a space is provided between the light-emitting and light-receiving region and the first color filter.

11. A display module comprising the display device according to claim 7, and a connector or an integrated circuit.

12. An electronic device comprising:
the display module according to claim 11; and
at least one of an antenna, a battery, a housing, a camera, a speaker, a microphone, a touch sensor, and an operation button.

13. A display device comprising:
a light-emitting and light-receiving element over a first substrate;
a first color filter above the light-emitting and light-receiving element; and
a second substrate over the light-emitting and light-receiving element and the first color filter,
wherein the first color filter is provided with a first surface of the second substrate,
wherein the light-emitting and light-receiving element comprises a light-emitting and light-receiving region configured to emit light of a first color and receive light of a second color,
wherein the light-emitting and light-receiving element includes at least an EL layer and a photoelectric conversion layer between a pixel electrode and a common electrode,
wherein the first color filter is configured to transmit the light of the first color and block the light of the second color,
wherein the first color filter comprises an opening over the light-emitting and light-receiving region, and
wherein in a plan view, the light-emitting and light-receiving region comprises a portion located inside the opening.

14. The display device according to claim 13, further comprising a functional layer,
wherein the functional layer is provided on and in contact with a second surface of the second substrate opposite to the first surface where the first color filter is provided, and
wherein a refractive index of the functional layer is lower than a refractive index of the second substrate.

15. The display device according to claim 13,
wherein when a distance between the light-emitting and light-receiving element and the second substrate is T1 and a minimum width of the light-emitting and light-receiving region of the light-emitting and light-receiving element is W1, T1 is greater than or equal to 0.1 times and less than or equal to 10 times as large as W1.

16. The display device according to claim 15,
wherein when a thickness of the second substrate is T2, T2 is greater than or equal to 5 times and less than or equal to 100 times as large as T1.

17. The display device according to claim 13,
wherein in the plan view, a portion of the first color filter and an end portion of the light-emitting and light-receiving region overlap with each other.

18. The display device according to claim 13,
wherein in the plan view, an end portion of the light-emitting and light-receiving region is located inside the opening and a space is provided between the light-emitting and light-receiving region and the first color filter.

19. The display device according to claim 13, further comprising a light-emitting element provided adjacent to the light-emitting and light-receiving element,
wherein the light-emitting element is configured to emit the light of the second color.

20. The display device according to claim 13, further comprising a light-blocking layer above the light-emitting and light-receiving element,
wherein the light-blocking layer is configured to block the light of the first color and the light of the second color.

21. A display module comprising the display device according to claim 13, and a connector or an integrated circuit.

22. An electronic device comprising:
the display module according to claim 21; and
at least one of an antenna, a battery, a housing, a camera, a speaker, a microphone, a touch sensor, and an operation button.

* * * * *